US012805163B2

(12) United States Patent
Kim

(10) Patent No.: US 12,805,163 B2
(45) Date of Patent: Nov. 17, 2026

(54) DISPLAY DEVICE AND MANUFACTURING METHOD OF THE SAME

(71) Applicant: Samsung Display Co., LTD., Yongin-si (KR)

(72) Inventor: Joon-Hyung Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 354 days.

(21) Appl. No.: 18/433,132

(22) Filed: Feb. 5, 2024

(65) Prior Publication Data

US 2024/0389435 A1 Nov. 21, 2024

(30) Foreign Application Priority Data

May 17, 2023 (KR) ........................ 10-2023-0063979

(51) Int. Cl.
*H10K 59/80* (2023.01)
*H10K 59/12* (2023.01)
*H10K 59/122* (2023.01)

(52) U.S. Cl.
CPC ....... *H10K 59/875* (2023.02); *H10K 59/1201* (2023.02); *H10K 59/122* (2023.02)

(58) Field of Classification Search
CPC .................................................... H01K 59/875
USPC ............................................................ 257/91
See application file for complete search history.

(56) References Cited

U.S. PATENT DOCUMENTS 8,734,762 B2 5/2014 Chung et al.
11,194,083 B2 12/2021 Lee et al.
2021/0327964 A1* 10/2021 Jeon ........................ H10K 59/12

FOREIGN PATENT DOCUMENTS

KR 100957560 B1 5/2010
KR 101550830 B1 9/2015
KR 101793741 B1 11/2017
KR 1020220099448 A 7/2022
KR 102432351 B1 8/2022
WO WO-2020066049 A1 * 4/2020 ............... C08K 9/04

* cited by examiner

*Primary Examiner* — Ajay Arora
(74) *Attorney, Agent, or Firm* — CANTOR COLBURN LLP

(57) ABSTRACT

A display device includes a lower panel including a light emitting element layer, and an upper panel disposed on the lower panel, where the upper panel includes a partition pattern, an optical control layer including multiple optical control portions which are separately disposed by the partition pattern, and a color filter layer including multiple color filters which are separately disposed by the partition pattern, and disposed on the optical control layer. Each of the optical control layer and the color filter layer includes color conversion particles and color filter particles, a particle number per unit volume of the color conversion particles is greater in the optical control layer than in the color filter layer, and a particle number per unit volume of the color filter particles is greater in the color filter layer than in the optical control layer.

14 Claims, 13 Drawing Sheets

DISPLAY DEVICE AND MANUFACTURING METHOD OF THE SAME

This application claims priority to Korean Patent Application No. 10-2023-0063979, filed on May 17, 2023, and all the benefits accruing therefrom under 35 U.S.C. § 119, the content of which in its entirety is herein incorporated by reference.

BACKGROUND

1. Field

The disclosure herein relates to a display device and a manufacturing method of the display device, more particularly, to a display device including an optical control panel and a manufacturing method of the display device.

2. Description of the Related Art

Various multimedia display devices such as televisions, mobile phones, tablet computers and game consoles typically include a display panel and an optical control panel for providing image information to users.

The display panel may include a light emitting element and a pixel circuit for driving the light emitting element. The optical control panel may include an optical control portion using quantum dots, and source light provided from the light emitting element of the display panel may be converted by the optical control portion to provide multicolored lights. In addition, the optical control panel may include a color filter for improving the color purity of light provided from the optical control portion.

SUMMARY

Embodiments of the disclosure provide a display device having high light extraction efficiency.

Embodiments of the disclosure provide a manufacturing method of a display device, having improved processability.

An embodiment of a display device includes: a lower panel including a light emitting element layer; and an upper panel disposed on the lower panel, where the upper panel includes: a partition pattern; an optical control layer including multiple optical control portions which are separately disposed by the partition pattern; and a color filter layer including multiple color filters which are separately disposed by the partition pattern, and disposed on the optical control layer, each of the optical control layer and the color filter layer includes color conversion particles and color filter particles, a particle number per unit volume of the color conversion particles is greater in the optical control layer than in the color filter layer, and a particle number per unit volume of the color filter particles is greater in the color filter layer than in the optical control layer.

In an embodiment, the color filter layer may include metal hydroxide particles, and a binder resin having a negative (−) surface zeta potential.

In an embodiment, each of the metal hydroxide particles may include at least one selected from aluminum (Al), magnesium (Mg), barium (Ba), and calcium (Ca).

In an embodiment, the binder resin having a negative (−) surface zeta potential may include at least one selected from a polyvinyl alcohol (PVA) resin, a (meth)acrylate copolymer resin, a polyvinyl butyral (PVB) resin, a hydroxypropyl cellulose (HPC) resin, a polyvinylpyrrolidone-vinyl acetate (PVP-VA) copolymer resin, and a polyacetal resin.

In an embodiment, each of the color conversion particles may include a phosphor or a quantum dot and has a negative (−) surface zeta potential, and each of the color filter particles may include a dye or a pigment and has a positive (+) surface zeta potential.

In an embodiment, each of the color conversion particles may include a quantum dot and a ligand, and the ligand may include: a first terminal portion combined with the quantum dot; a second terminal portion providing each of the color conversion particles with a negative (−) surface zeta potential; and an intermediate portion connected between the first terminal portion and the second terminal portion.

In an embodiment, a thickness of the optical control layer may be greater than a thickness of the color filter layer.

In an embodiment, the partition pattern may include a first portion disposed in a same layer as the color filter layer, and a second portion disposed under the first portion, the first portion may be a light shielding pattern, and the second portion may be a transparent pattern having lyophobicity.

An embodiment of a display device includes: a lower panel including a light emitting element layer; and an upper panel disposed on the lower panel, where the upper panel includes: a partition pattern; an optical control layer including multiple optical control portions which are separately disposed by the partition pattern; and a color filter layer including multiple color filters which are separately disposed by the partition pattern, and disposed on the optical control layer, and the color filter layer includes metal hydroxide particles, and a binder resin having a negative (−) surface zeta potential.

In an embodiment, each of the optical control layer and the color filter layer may include color conversion particles and color filter particles.

In an embodiment, each of the color conversion particles may include a phosphor or a quantum dot, and may have a negative (−) surface zeta potential, and each of the color filter particles may include a dye or a pigment, and may have a positive (+) surface zeta potential.

In an embodiment, each of the color conversion particles may include a quantum dot and a ligand, and the ligand may include: a first terminal portion combined with the quantum dot; a second terminal portion providing each of the color conversion particles with a negative (−) surface zeta potential; and an intermediate portion connected between the first terminal portion and the second terminal portion.

In an embodiment, a thickness of the optical control layer may be greater than a thickness of the color filter layer.

In an embodiment, the partition pattern may include a first portion disposed in a same layer as the color filter layer, and a second portion disposed under the first portion, the first portion may be a light shielding pattern, and the second portion may be a transparent pattern having lyophobicity.

An embodiment of a method of manufacturing the display device, includes: forming a partition pattern defining a pixel area including a first pixel area, a second pixel area, and a third pixel area on a base layer; applying a selective absorption material on the base layer to form a selective absorption layer in the pixel area; and injecting a first ink including first color filter particles and first color conversion particles on the selective absorption layer of the first pixel area to form a first color filter and a first optical control portion, where the first color filter is formed from the selective absorption layer including the first color filter particles, and the first optical control portion is formed on the first color filter from a first ink residue which is the first ink excluding a portion of the first color filter particles.

In an embodiment, the method of manufacturing the display device may further include: injecting a second ink including second color filter particles and second color conversion particles on the selective absorption layer of the second pixel area to form a second color filter and a second optical control portion, where the second color filter is formed from the selective absorption layer including the second color filter particles, and the second optical control portion is formed from a second ink residue which is the second ink excluding a portion of the second color filter particles.

In an embodiment, the method of manufacturing the display device may further include forming a planarizing layer on the pixel area and the partition pattern, where the forming the planarizing layer may include forming a third optical control portion in the third pixel area, and the planarizing layer and the third optical control portion may be formed as one body.

In an embodiment, the selective absorption material may include metal hydroxide particles, and a binder resin having a negative (−) surface zeta potential.

In an embodiment, each of the first color conversion particles may include a phosphor or a quantum dot, and may have a negative (−) surface zeta potential, and each of the first color filter particles may include a dye or a pigment, and may have a positive (+) surface zeta potential.

In an embodiment, the forming the partition pattern may include forming a light shielding pattern, and forming a transparent pattern on the light shielding pattern, where the transparent pattern may have lyophobicity . . .

BRIEF DESCRIPTION OF THE DRAWINGS

The accompanying drawings are included to provide a further understanding of embodiments of the invention and are incorporated in and constitute a part of this specification. The drawings illustrate embodiments of the invention and, together with the description, serve to explain principles of the invention. In the drawings.

DETAILED DESCRIPTION

Figure 1A:
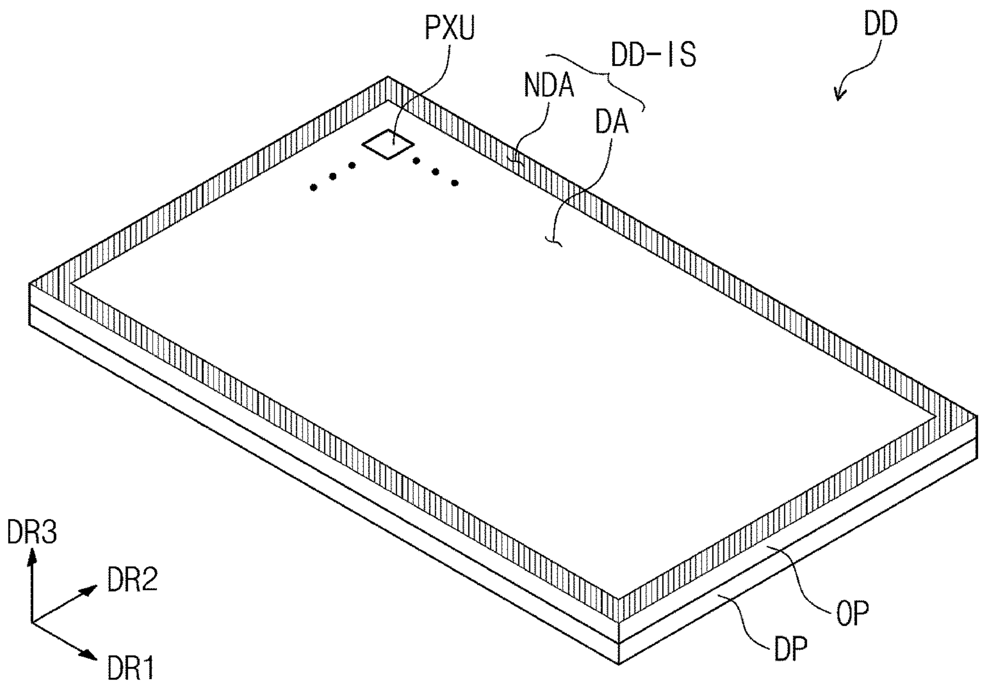
FIG. 1A is a perspective view of a display device according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. Thus, reference to "an" element in a claim followed by reference to "the" element is inclusive of one element and a plurality of the elements. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

In the description, when an element (or a region, a layer, a part, etc.) is referred to as being "on", "connected with" or "combined with" another element, it can be directly disposed on/connected with/combined with the other element, or intervening third elements may also be disposed.

In the description, the terms "below", "beneath", "on" and "above" are used for explaining the relation of elements shown in the drawings. The terms are relative concept and are explained based on the direction shown in the drawings.

In the description, "disposed on" may include disposition under as well as on an element.

In the description, "directly disposed" may mean that there is no additional film, layer, area and plate between a part such as a film, layer, area and another part. For example, "directly disposed" may mean that two layers or two members are disposed without using an additional member such as an adhesive member therebetween.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

In the description, it will be understood that, although the terms first, second, etc. may be used herein to describe various elements, these elements should not be limited by these terms. These terms are only used to distinguish one element from another element. For example, a first element could be termed a second element without departing from the scope of the invention. Similarly, a second element could be termed a first element.

Unless otherwise defined, all terms (including technical and scientific terms) used herein have the same meaning as commonly understood by one of ordinary skill in the art to which this invention belongs. In addition, it will be further understood that terms, such as those defined in commonly used dictionaries, should be interpreted as having a meaning that is consistent with their meaning in the context of the relevant art and will not be interpreted in an idealized or overly formal sense unless expressly defined so herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Like reference numerals refer to like elements throughout. In the drawings, the thicknesses, ratios, and dimensions of elements are exaggerated for effective explanation of technical contents.

Hereinafter, embodiments of a display device and a manufacturing method of the display device will be described with reference to the accompanying drawings.

Figure 1B:
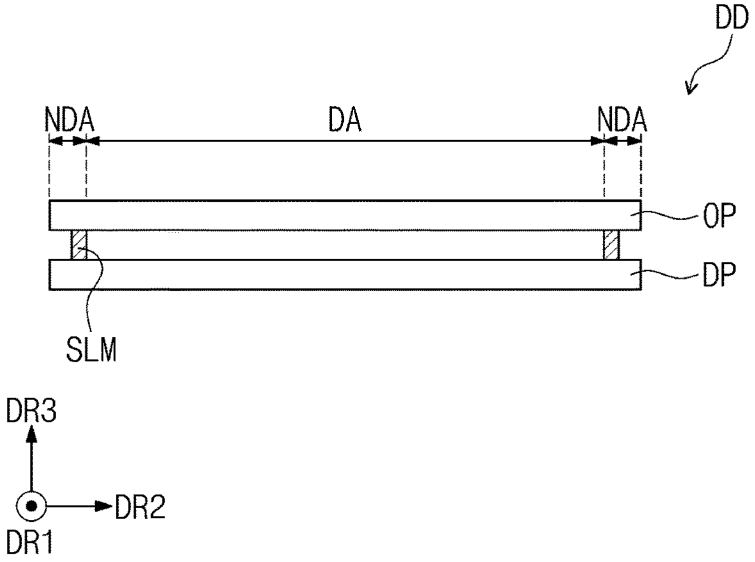
FIG. 1B is a cross-sectional view of a display device according to an embodiment of the invention.

FIG. 1A is a perspective view of a display device DD according to an embodiment of the invention. FIG. 1B is a cross-sectional view of a display device DD according to an embodiment of the invention.

Referring to FIG. 1A, an embodiment of a display device DD may display images through a display surface DD-IS. The display surface DD-IS may be parallel to a plane defined by a first direction DR1 and a second direction DR2. The top surface of a member disposed at the uppermost of the display device DD in a third direction DR3 may be defined as the display surface DD-IS.

The normal direction of the display surface DD-IS, i.e., a thickness direction of the display device DD, may be indicated by the third direction DR3. The front surface (or top surface) and the rear surface (or bottom surface) of each layer explained below may be distinguished by the third direction DR3.

In an embodiment, the display device DD may include a display area DA and a non-display area NDA. In such an embodiment, unit pixels PXU are disposed in the display area DA, and unit pixels PXU are not disposed in the non-display area NDA. The non-display area NDA may be defined along the border of the display surface DD-IS. The non-display area NDA may surround the display area DA. In an embodiment of the invention, the non-display area NDA may be omitted or disposed only at one side of the display area DA. In FIG. 1A, an embodiment where a display device DD has a planar or flat shape is shown as an example, but not being limited thereto. Alternatively, the display device DD may have a curved shape, or may be capable of folding, rolling or sliding from a housing.

The unit pixel PXU shown in FIG. 1A may define a pixel row and a pixel column. The unit pixel PXU is the minimum repeating unit, and the unit pixel PXU may include at least one pixel. The unit pixel PXU may include multiple pixels (or sub-pixels) that emit different colored lights, respectively.

Referring to FIG. 1B, an embodiment of the display device DD may include a display panel DP and an optical control panel OP separately facing the display panel DP. The display panel DP may be referred to as a lower panel or a lower display substrate, and the optical control panel OP may be referred to as an upper panel or an upper display substrate. In an embodiment, a certain cell gap may be formed between the display panel DP and the optical control panel OP. The cell gap may be maintained by a sealing member SML that combines the display panel DP and the optical control panel OP to each other. The sealing member SML may include a binder resin, and inorganic fillers mixed with the binder resin. The sealing member SLM may further include other additives. The additive may include an amine-based curing agent and a photoinitiator. The additive may further include a silane-based additive and an acrylic additive. The sealing member SML may include an inorganic material like frit.

In each of the display panel DP and the optical control panel OP, a display areas DA and a non-display areas NDA corresponding to the display area DA and the non-display area NDA of the display device DD may be defined. Hereinafter, the display area DA of the display device DD may include the display areas DA of the display panel DP and the optical control panel OP, and the non-display area NDA of the display device DD may include the non-display areas NDA of the display panel DP and the optical control panel OP.

Figure 2:
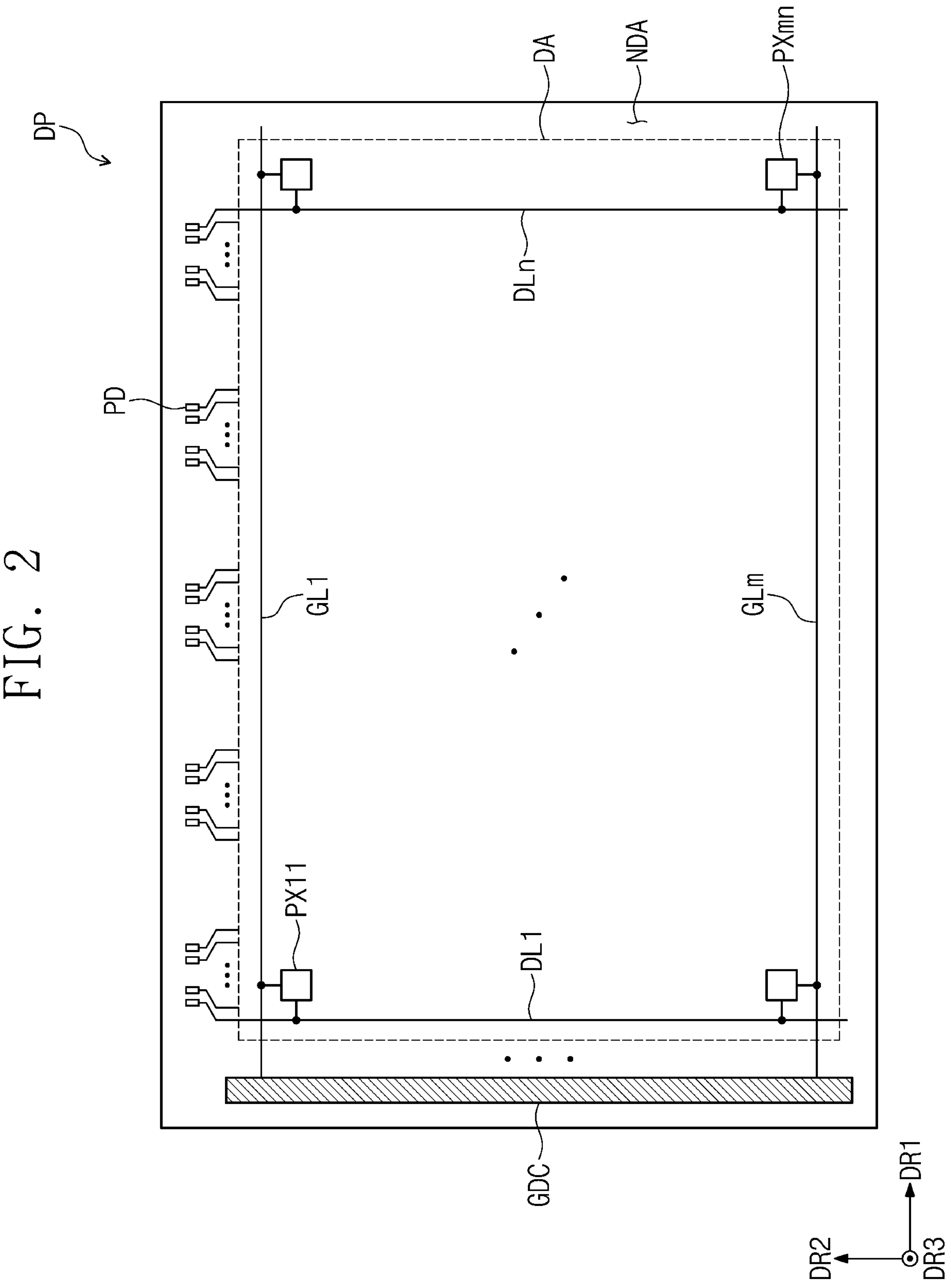
FIG. 2 is a plan view of a display panel according to an embodiment of the invention.

FIG. 2 is a plan view of a display panel DP according to an embodiment of the invention.

In FIG. 2, the relation of the arrangement on a plane of signal lines GL1-GLm and DL1-DLn, and pixels PX11-PXmn is shown. The signal lines GL1-GLm and DL1-DLn may include multiple gate lines GL1-GLm, and multiple data lines DL1-DLn. Here, n and m are natural numbers.

Each of the pixels PX11-PXmn may be connected with a corresponding gate line among the multiple gate lines signal lines GL1-GLm, and a corresponding data line among the multiple data lines DL1-DLn. Each of the pixels PX11-PXmn may include a pixel driving circuit and a light emitting element. According to the configuration of the pixel driving circuit of the pixels PX11-PXmn, other types of signal lines may be additionally provided in the display panel DP. In an embodiment, for example, each of the gate lines GL1-GLm may include a corresponding scan line SCLi (FIG. 3) and a corresponding sensing line SSLi (FIG. 3).

In an embodiment, a gate driving circuit GDC may be integrated on the display panel DP through an oxide semiconductor gate driver circuit (OSG) process or an amorphous silicon gate driver circuit (ASG) process. The gate driving circuit GDC connected with the gate lines GL1-GLm may be disposed at one side of the non-display area NDA in the first direction DR1. Pads PD connected at the terminals of the multiple data lines DL1-DLn may be disposed at one side of the non-display area NDA in the second direction DR2.

Figure 3:
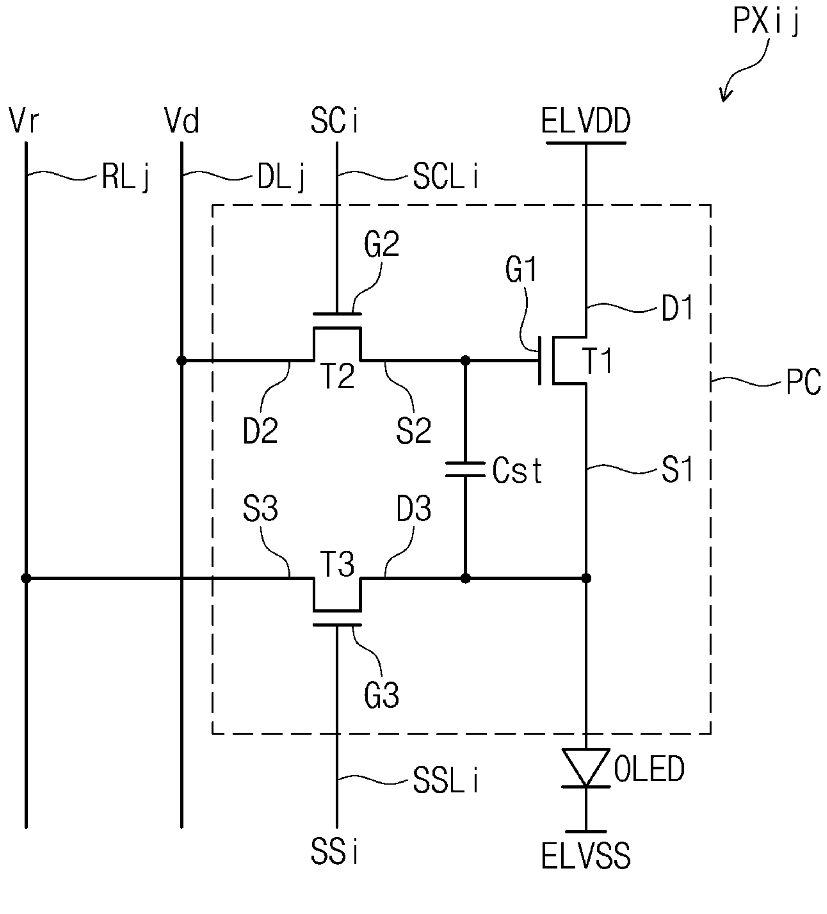
FIG. 3 is an equivalent circuit diagram of a pixel according to an embodiment of the invention.

FIG. 3 is an equivalent circuit diagram of a pixel PXij according to an embodiment of the invention.

In FIG. 3, an embodiment of a pixel PXij that is connected with an i-th scan line SCLi, an i-th sensing line SSLi, a j-th data line DLj, and a j-th reference line RLj, is shown as an example. The pixel PXij may include a pixel circuit PC and a light emitting element OLED connected with the pixel circuit PC. The pixel circuit PC may include multiple transistors T1, T2 and T3, and a capacitor Cst. In an embodiment, the multiple transistors T1, T2 and T3 may be formed through a low temperature polycrystalline silicon (LTLPS) process or a low temperature polycrystalline oxide (LTPO) process. Hereinafter, an embodiment where the multiple transistors T1, T2 and T3 are n-type transistors will be described, but not being limited thereto. Alternatively, at least one transistor of the pixel PXij may be a p-type transistor.

In an embodiment, as shown in FIG. 3, the pixel circuit PC may include the first transistor T1, the second transistor T2, the third transistor T3, and the capacitor Cst, but the pixel circuit PC is not limited thereto. The first transistor T1 may be a driving transistor, the second transistor T2 may be a switching transistor, and the third transistor T3 may be a sensing transistor. In an alternative embodiment, the pixel circuit PC may further include an additional transistor or an additional capacitor.

The light emitting element OLED may be an organic light emitting element or an inorganic light emitting element, including an anode (first electrode) and a cathode (second electrode). The anode of the light emitting element OLED may receive a first voltage ELVDD through the first transistor T1, and the cathode of the light emitting element OLED may receive a second voltage ELVSS. The light emitting element OLED may receive the first voltage ELVDD and the second voltage ELVSS and emit light.

The first transistor T1 may include a drain D1 that receives the first voltage ELVDD, a source S1 connected with the anode of the light emitting element OLED, and a gate G1 connected with the capacitor Cst. The first transistor T1 may control a driving current flowing from the first voltage ELVDD to the light emitting element OLED, correspondingly to a voltage value stored in the capacitor Cst.

The second transistor T2 may include a drain D2 connected with a j-th data line DLj, a source S2 connected with the capacitor Cst, and a gate G2 that receives an i-th first scan signal SGi. The j-th data line DLj may receive a data voltage Vd. The second transistor T2 may response to the i-th first scan signal and may provide the first transistor T1 with the data voltage Vd.

The third transistor T3 may include a source S3 connected with a j-th reference line RLj, a drain D3 connected with the anode of the light emitting element OLED, and a gate G3 that receives a j-th second scan signal SSi. The j-th reference line RLj may receive a reference voltage Vr. The third transistor T3 may reset the capacitor Cst and the anode of the light emitting element OLED.

The capacitor Cst may store a voltage corresponding to a difference between a voltage received from the second transistor T2 and the first voltage ELVDD. The capacitor Cst may be connected with the gate G1 of the first transistor T1 and the anode of the light emitting element OLED.

Figure 4:
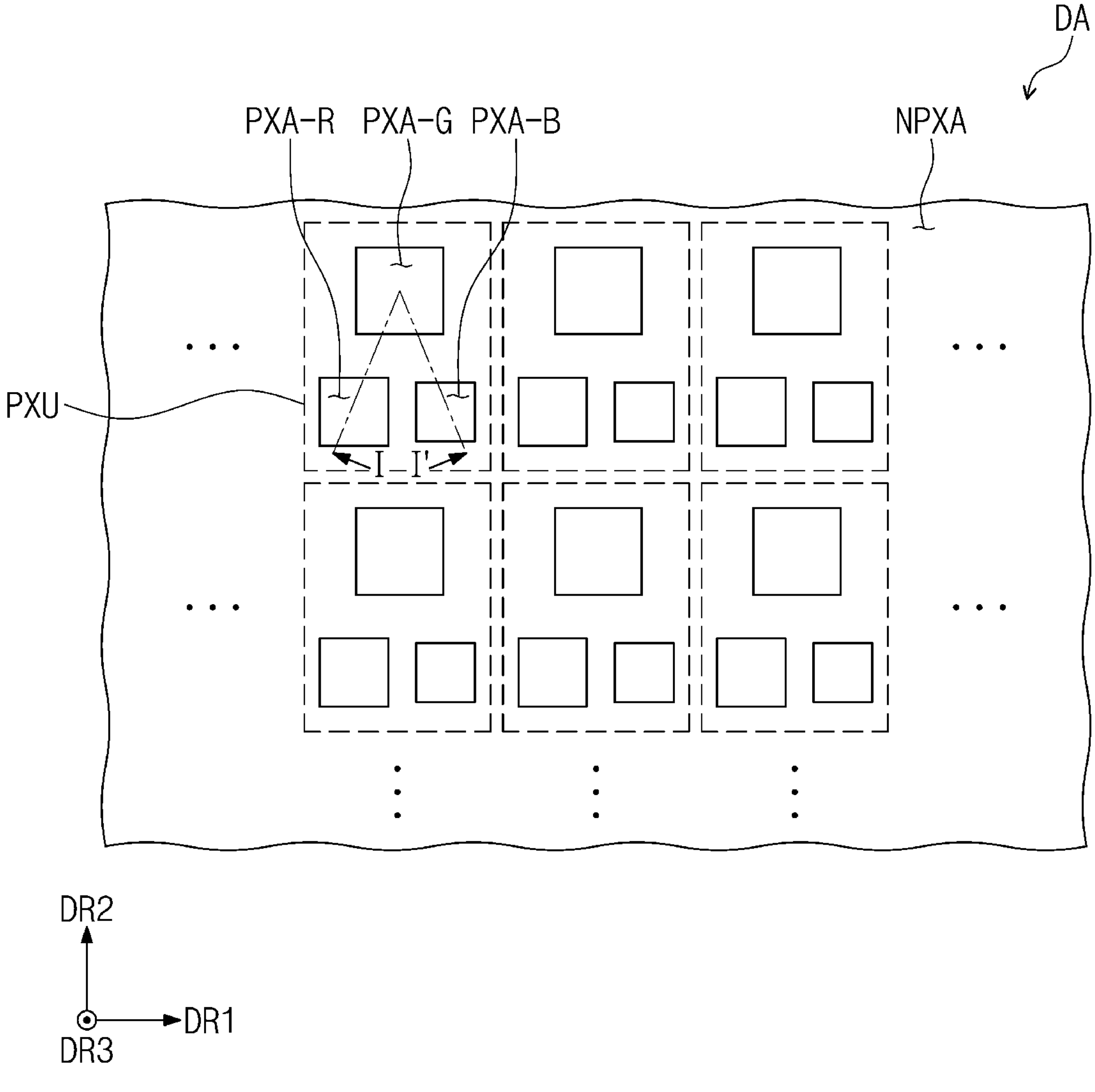
FIG. 4 is an enlarged plan view of a display area according to an embodiment of the invention.

FIG. 4 is an enlarged plan view of a display area DA according to an embodiment of the invention.

In an embodiment, as shown in FIG. 4, the unit pixels PXU may be arranged in the first direction DR1 and the second direction DR2. In an embodiment, the unit pixel PXU may include a first pixel, a second pixel and a third pixel, which emit different colored lights from each other. In an embodiment, red light, green light and blue light may be emitted from the first pixel, second pixel and third pixel, respectively. In FIG. 4, a first pixel area PXA-R, a second pixel area PXA-G, and a third pixel area PXA-B corresponding to the first pixel, second pixel and third pixel, respectively, are shown as an example. The first pixel area PXA-R may be an area for providing light generated in the first pixel to an outside, the second pixel area PXA-G may be an area for providing light generated in the second pixel to the outside, and the third pixel area PXA-B may be an area for providing light generated in the third pixel to the outside.

The peripheral area NPXA may be disposed or defined to surround the first pixel area PXA-R, the second pixel area PXA-G and the third pixel area PXA-B. In addition, the peripheral area NPXA may be disposed or defined in areas between the first pixel area PXA-R, the second pixel area PXA-G and the third pixel area PXA-B. The peripheral area NPXA may set the boundary of the first to third pixel areas PXA-R, PXA-G and PXA-B, and may prevent the color mixing among the first to third pixel areas PXA-R, PXA-G and PXA-B.

Referring to FIG. 4, the first pixel area PA-R and the third pixel area PXA-R may be disposed in a same row, and the second pixel area PXA-G may be disposed in a different row from the first pixel area PXA-R and the third pixel area PXA-R. The second pixel area PXA-G may have the largest area, and the third pixel area PXA-B may have the smallest area, but an embodiment of the invention is not limited thereto. In an embodiment, the first pixel area PXA-R, the second pixel area PXA-G, and the third pixel area PXA-B have substantially square shapes, but this is merely an example, and an embodiment of the invention is not limited thereto.

Figure 5:
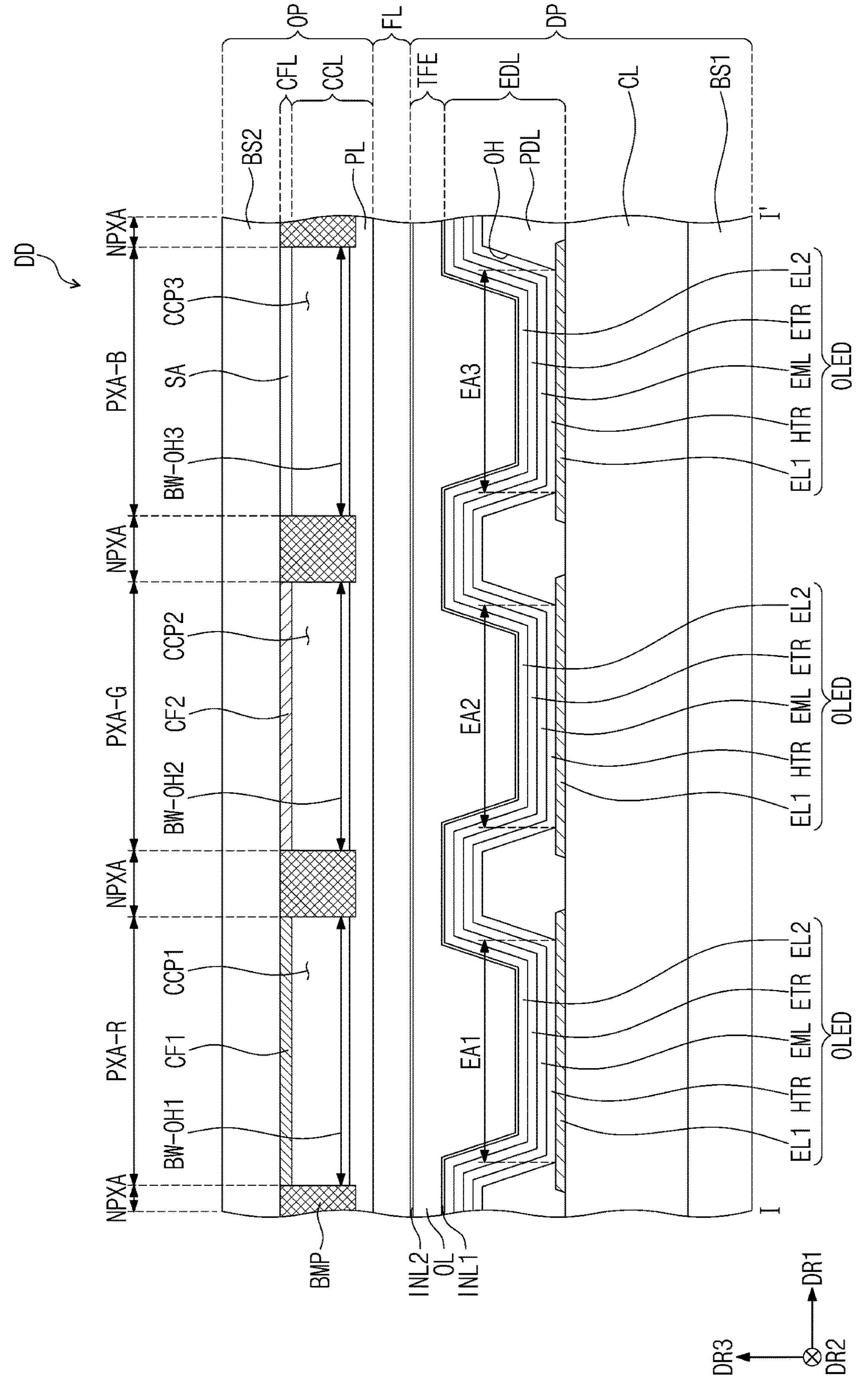
FIG. 5 is a cross-sectional view of a portion of a display device according to an embodiment of the invention.

FIG. 5 is a cross-sectional view of a portion of a display device DD according to an embodiment of the invention.

FIG. 5 shows a cross-section corresponding to I-I' in FIG. 4, but this is an example, and an embodiment of the invention is not limited thereto. In FIG. 5, the cross-sections of the first to third pixel areas PXA-R, PXA-G and PXA-B are shown as an example.

In an embodiment, a display panel DP may include a first base layer BS1, a circuit layer CL, a light emitting element layer EDL, and a thin film encapsulating layer TFE. The circuit layer CL may be disposed on the first base layer BS1. The light emitting element layer EDL may be disposed on the circuit layer CL. The thin film encapsulating layer TFE may be disposed on the light emitting element layer EDL and may seal the light emitting element layer EDL.

The first base layer BS1 may include glass or a synthetic resin layer. The synthetic resin layer may include a thermosetting resin. in an embodiment, the synthetic resin layer may be a polyimide-based resin layer, but the material thereof is not specifically limited. The synthetic resin layer may include at least one selected from an acrylic resin, a methacrylic resin, polyisoprene, a vinyl-based resin, an epoxy-based resin, a urethane-based resin, a cellulose-based resin, a siloxane-based resin, a polyamide-based resin and a perylene-based resin. In addition, the first base layer BS1 may include a glass substrate, a metal substrate, or an organic/inorganic composite material substrate.

The circuit layer CL may be disposed on the first base layer BS1. The circuit layer CL may include an insulating layer, a semiconductor pattern, a conductive pattern, and a signal line. In an embodiment, an insulating layer, a semiconductor layer, and a conductive layer may be formed on the first base layer BS1 by a method including coating, deposition, or the like, and the insulating layer, semiconductor layer, and the conductive layer may be selectively patterned through multiple photolithography processes. Accordingly, a semiconductor pattern, a conductive pattern, and a signal line may be formed in the circuit layer CL. The circuit layer CL may include a transistor, a buffer layer and multiple insulating layers.

The light emitting element layer EDL may be disposed on the circuit layer CL and may include a light emitting element OLED and a pixel definition layer PDL.

The light emitting element OLED may include a first electrode EL1, a second electrode EL2 oppositely disposed to the first electrode EL1, and an emission layer EML disposed between the first electrode EL1 and the second electrode EL2. The emission layer EML included in the light emitting element OLED may include an organic light emitting material as a light emitting material or a quantum dot. The light emitting element OLED may further include a hole transport region HTR and/or an electron transport region ETR. In an embodiment, though not shown, the light emitting element OLED may further include a capping layer (not shown) disposed on the second electrode EL2.

The pixel definition layer PDL may be disposed on the circuit layer CL and may cover a portion of the first electrode EL1. In the pixel definition layer PDL, a luminous opening part OH may be defined. The luminous opening part OH of the pixel definition layer PDL may expose at least a portion of the first electrode EL1. First to third luminous areas EA1, EA2 and EA3 may be defined correspondingly to portions of the first electrode EL1 exposed by the luminous opening part OH of the pixel definition layer PDL. The first luminous area EA1, the second luminous area EA2, and the third luminous area EA3 may correspond to the first pixel area PXA-R, the second pixel area PXA-G, and the third pixel area PXA-B, respectively. The area excluding the first to third luminous areas EA1, EA2 and EA3 may be defined as non-luminous areas.

In the description, "corresponding" means that two elements overlap each other when viewed in the thickness direction DR3 (or in a plan view) of the display device DD and is not limited to a case having a same area as each other. The first to third luminous areas EA1, EA2 and EA3 may overlap the first to third pixel areas PXA-R, PXA-G and PXA-B, respectively. In the plan view or when viewed in the third direction DR3, the areas of the first to third pixel areas PXA-R, PXA-G and PXA-B may be greater than the areas of the first to third luminous areas EA1, EA2 and EA3, distinguished by the pixel definition layer PDL. However, this is an example, and an embodiment of the invention is not limited thereto. The areas of the pixel areas PXA-R, PXA-G and PXA-B may be substantially the same as the areas of the first to third luminous areas EA1, EA2 and EA3, respectively.

The first electrode EL1 may be disposed on the circuit layer CL. The first electrode EL1 may be an anode or a cathode. In addition, the first electrode EL1 may be a pixel electrode. The first electrode EL1 may be a transmissive electrode, a transflective electrode, or a reflective electrode.

The hole transport region HTR may be disposed on the first electrode EL1. The hole transport region HTR may be commonly disposed in the first to third luminous areas EA1, EA2 and EA3, and the non-luminous area. A common layer like the hole transport region HTR may be disposed so as to overlap with the multiple pixel units PXU in the display area DA shown in FIG. 4. However, an embodiment of the invention is not limited thereto, and the hole transport region HTR may be separately disposed correspondingly to each of the first to third luminous areas EA1, EA2 and EA3. The hole transport region HTR may include at least one selected from a hole transport layer, a hole injection layer, and an electron blocking layer.

The emission layer EML may be disposed on the hole transport region HTR. The emission layer EML may be commonly disposed in the first to third luminous areas EA1, EA2 and EA3, and the non-luminous area. The emission layer EML may be disposed while overlapping the whole of the hole transport region HTR and the electron transport region ETR. However, an embodiment of the invention is not limited thereto, and in an embodiment, the emission layer EML may be disposed in the luminous opening part OH. That is, the emission layer EML may be separately disposed to correspond to the first to third luminous areas EA1, EA2 and EA3, distinguished by the pixel definition layer PDL.

The emission layer EML may generate source light. In an embodiment, the emission layer EML may emit blue light. In an embodiment the display device DD, blue light may be the source light. In an embodiment, where the emission layer EML is separately disposed correspondingly to the first to third luminous areas EA1, EA2 and EA3, the emission layer EML all may emit blue light, or emit different wavelengths of light in each of the first to third luminous areas EA1, EA2 and EA3.

The emission layer EML may have a single layer structure formed using a single material, a single layer structure formed using multiple different materials, or a multilayer structure including multiple layers formed using multiple different materials. The emission layer EML may include a fluorescence or phosphorescence material. In the light emitting element according to an embodiment, the emission layer EML may include a light emitting material such as an organic light emitting material, an organometal complex, and a quantum dot.

In an embodiment, the emission layer EML may have a multilayer structure. In an embodiment, for example, the emission layer EML may include a first emission layer, a charge generating layer, and a second emission layer, which emit light having different color from the first emission layer, stacked in this order along the third direction DR3. The first emission layer may emit, for example, blue light, and the second emission layer may emit, for example, green light. The charge generating layer may be disposed between the first emission layer and the second emission layer to provide each of the first emission layer and the second emission layer with electrons or holes to improve emission efficiency.

The electron transport region ETR may be disposed on the emission layer EML. The electron transport region ETR may include at least one selected from an electron injection layer, an electron transport layer, and a hole blocking layer. The electron transport region ETR may be disposed as a common layer to overlap with the whole of the first to third luminous areas EA1, EA2 and EA3, and the pixel definition layer PDL. However, an embodiment of the invention is not limited thereto, but the electron transport region ETR may be separately disposed corresponding to each of the first to third luminous areas EA1, EA2 and EA3.

The second electrode EL2 may be disposed on the electron transport region ETR. The second electrode EL2 may be a common electrode. The second electrode EL2 may be a cathode or an anode, but an embodiment of the invention is not limited thereto. In an embodiment, for example, the first electrode EL1 is an anode, and the second electrode EL2 may be a cathode. Alternatively, the first electrode EL1 is a cathode, and the second electrode EL2 may be an anode. The second electrode EL2 may be a transmissive electrode, a transflective electrode, or a reflective electrode.

The thin film encapsulating layer TFE may be disposed on the second electrode EL2. In an embodiment, where the light emitting element OLED includes a capping layer (not shown), the thin film encapsulating layer TFE may be disposed on the capping layer (not shown). The encapsulating layer TFE may protect the light emitting element layer EDL from moisture and oxygen, and prevent the introduction of foreign materials like dust into the light emitting element layer EDL.

The thin film encapsulating layer TFE may include at least one of inorganic layers INL1 and INL2. The inorganic layers INL1 and INL2 may include at least one selected from silicon nitride, silicon oxynitride, silicon oxide, titanium oxide and aluminum oxide. The thin film encapsulating layer TFE may include at least one organic layer OL. The organic layer OL may include an organic polymer material formed from an acrylate resin, or the like. However, this is an example, and an embodiment of the invention is not limited thereto.

The optical control panel OP may be disposed on the display panel DP. The optical control panel OP may include a second base layer BS2, a partition pattern BMP, a color filter layer CFL, and an optical control layer CCL. The partition pattern BMP may be disposed under the second base layer BS2. The color filter layer CFL may be disposed under the second base layer BS2. The optical control layer CCL may be disposed under the color filter layer CFL.

The second base layer BS2 may be a member for providing a base surface on which the color filter layer CFL, or the like is disposed. The second base layer BS2 may include glass or a synthetic resin layer. The synthetic resin layer may include a thermosetting resin. In an embodiment, for example, the synthetic resin layer may be a polyimide-based resin layer, but the material thereof is not specifically limited. The synthetic resin layer may include at least one selected from an acrylic resin, a methacrylic resin, polyisoprene, a vinyl-based resin, an epoxy-based resin, a urethane-based resin, a cellulose-based resin, a siloxane-based resin, a polyamide-based resin and a perylene-based resin. In addition, the second base layer BS2 may include a glass substrate, a metal substrate, or an organic/inorganic composite material substrate.

The partition pattern BMP may be disposed under the second base layer BS2. The partition pattern BMP may be disposed corresponding to the peripheral region NPXA that is disposed among the pixel areas PXA-R, PXA-G and PXA-B. The partition pattern BMP may define the boundary between the pixel areas PXA-R, PXA-G and PXA-B. A first color filter CF1, a second color filter CF2 and a selective absorption layer SA, which will be described later in detail, may be separately disposed by the partition pattern BMP. The first color filter CF1, the second color filter CF2 and the selective absorption layer SA may be disposed in opening parts BW-OH1, BW-OH2 and BW-OH3, defined by the partition pattern BMP. In addition, first to third optical control portions CCP1, CCP2 and CCP3, which will be described later in detail, may be separately disposed by the partition pattern BMP. The first to third optical control portions CCP1, CCP2 and CCP3 may be separately disposed in the opening parts BW-OH1, BW-OH2 and BW-OH3, defined by the partition pattern BMP.

The partition pattern BMP may include a material having a transmittance of a certain value or less. In an embodiment, for example, the partition pattern BMP may include a light shielding material and may include a black coloring agent. The partition pattern BMP may include a black dye or a black pigment mixed in a base resin. The partition pattern BMP may include, for example, carbon black, a metal like chromium or oxides thereof as a black component. The partition pattern BMP may include, for example, at least one selected from propylene glycol methyl ether acetate, 3-methoxy-n-butyl acetate, an acrylate monomer, an acrylic monomer, an organic pigment, and acrylate ester.

The color filter layer CFL may be disposed under the second base layer BS2. The color filter layer CFL may include color filters CF1 and CF2, and a selective absorption layer SA. The color filter layer CFL may include a first color filter CF1 that selectively transmits second color light in the first pixel area PXA-R, and a second color filter CF2 that selectively transmits third color light in the second pixel area PXA-G. In an embodiment, for example, the first color filter CF1 may be a red color filter, and the second color filter CF2 may be a green color filter. In an embodiment, the first color filter CF1 and the second color filter CF2 may be yellow color filters. The first color filter CF1 and the second color filter CF2 may not be separated and may be provided in a one body, e.g., integrally formed with each other as a single unitary and indivisible part. The color filter layer CFL may include the selective absorption layer DA in the third pixel area PXA-B. Detailed description of the selective absorption layer SA will be given later.

The first color filter CF1 may transmit only light in a partial wavelength region of the second color light, i.e., a central wavelength region to increase color purity. The second color filter CF2 may transmit only light in a partial wavelength region of the third color light, i.e., a central wavelength region to increase color purity. The selective absorption layer SA may transmit only light provided from the optical control layer CCL.

Each of the first and second color filters CF1 and CF2 may include color filter particles. The color filter particles may include a pigment or a dye. The first color filter CF1 may include a red pigment or dye, and the second color filter CF2 may include a green pigment or dye. The color filter particles may be used alone, or two or more types may be used in combination.

Figure 7A:
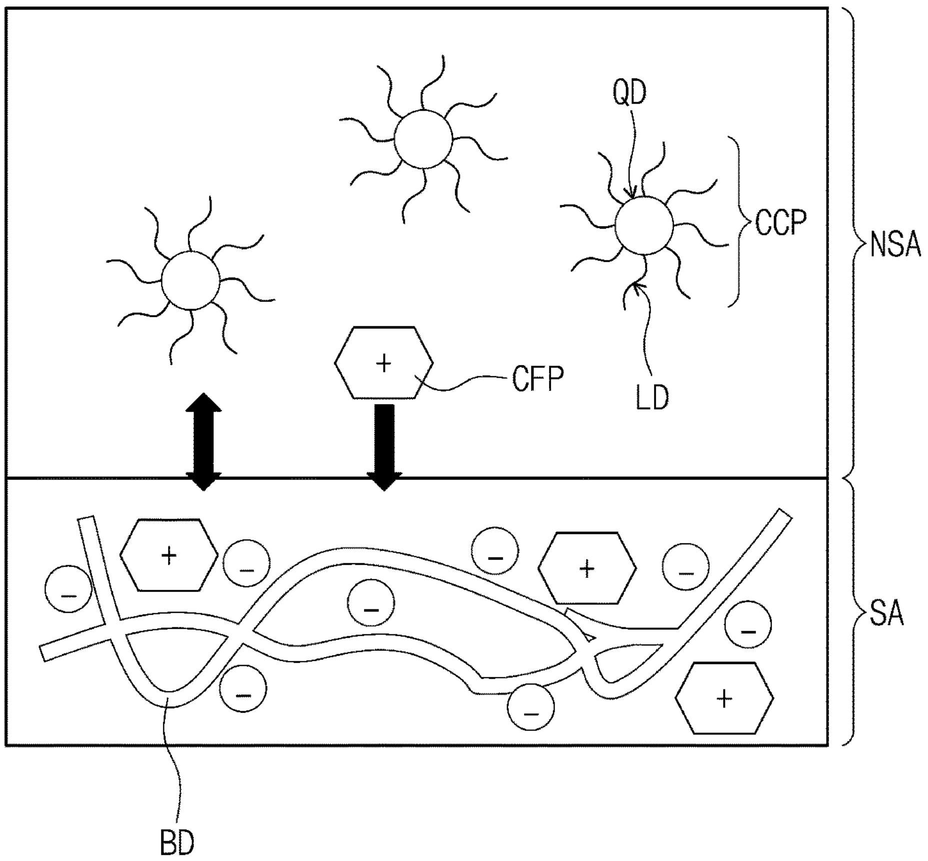
FIG. 7A is a schematic diagram showing a process of a method of manufacturing a display device according to an embodiment of the invention.

As the dye, Color Index (C. I.) Solvent Red 1, 2, 3, 4, 8, 16, 17, 18, 19, 23, 24, 25, 26, 27, 30, 33, 35, 41, 43, 45, 48, 49, 52, 68, 69, 72, 73, 83:1, 84:1, 89, 90, 90:1, 91, 92, 106, 109, 110, 118, 119, 122, 124, 125, 127, 130, 132, 135, 141, 143, 145, 146, 149, 150, 151, 155, 160, 161, 164, 164:1, 165, 166, 168, 169, 172, 175, 179, 180, 181, 182, 195, 196, 197, 198, 207, 208, 210, 212, 214, 215, 218, 222, 223, 225, 227, 229, 230, 233, 234, 235, 236, 238, 239, 240, 241, 242, 243, 244, 245, 247, 248, Solvent Blue 2, 3, 4, 5, 7, 18, 25, 26, 35, 36, 37, 38, 43, 44, 45, 48, 51, 58, 59, 59:1, 63, 64, 67, 68, 69, 70, 78, 79, 83, 94, 97, 98, 100, 101, 102, 104, 105, 111, 112, 122, 124, 128, 129, 132, 136, 137, 138, 139, 143, Solvent Green 1, 3, 4, 5, 7, 28, 29, 32, 33, 34, 35, Acid Red 6, 11, 26, 51, 52, 60, 87, 88, 92, 94, 111, 186, 215, 289, 388, Acid Green 25, 27, Acid Blue 22, 25, 40, 78, 92, 113, 129, 167, 230, Acid Yellow 17, 23, 25, 36, 38, 42, 44, 72, 78, Acid Violet 9, 30, Basic Red 1, 2, 13, 14, 22, 27, 29, 39, Basic Green 3, 4, Basic Blue 3, 9, 41, 66, Basic Violet 1, 3, 18, 39, 66, Basic Yellow 11, 23, 25, 28, 41, Direct Red 4, 23, 31, 75, 76, 79, 80, 81, 83, 84, 149, 224, Direct Green 26, 28, Direct Blue 71, 78, 98, 106, 108, 192, 201, Direct Violet 51, Direct Yellow 26, 27, 28, 33, 44, 50, 86, 142, or the like may be used, but an embodiment of the invention is not limited thereto. The dye may use a cationic dye to be selectively adsorbed well into the selective absorption layer SA (FIG. 7A). In an embodiment, for example, the dye may use an azo-based, a triarylmethane-based, anthraquinone-based, or heterocyclic dye.

As the pigment, Color Index (C. I.) Red 5, 9, 81, 83, 88, 112, 144, 149, 168, 170, 176, 177, 188, 207, 209, 254, 255, 264, Yellow 3, 40, 73, 74, 83, 97, 128, 138, 139, 154, 223, Green 7, 17, 26, 36, Blue 15:6, 27, 28, 29, 33, 60, Violet 14, 19, 23, 37, 42, or the like may be used, but an embodiment of the invention is not limited thereto.

In case where a pigment is used, surface treatment may be performed using a dispersant for dispersion stability. In this case, a cationic dispersant may be used for easy selective adsorption by the selective absorption layer SA (FIG. 7A). The cationic dispersant may use, for example, polydimethyldiallylammonium chloride (PolyDADMAC), polyamine (for example, polyethyleneimine), or polyquaternium (for example, Polyquaternium-10).

In addition, each of the first and second color filters CF1 and CF2 may include a small amount of color conversion particles. Each of the first and second color filters CF1 and CF2, and the selective absorption layer SA may include metal hydroxide particles, and a binder resin having a negative (−) surface zeta potential.

Each of the first and second color filters CF1 and CF2, and the selective absorption layer SA may be disposed correspondingly to the first to third pixel areas PXA-R, PXA-G and PXA-B, that is, the first and second color filters CF1 and CF2, and the selective absorption layer SA may be disposed in the first to third pixel areas PXA-R, PXA-G and PXA-B, respectively. In addition, each of the first and second color filters CF1 and CF2, and the selective absorption layer SA may be disposed correspondingly to the first to third optical control portions CCP1, CCP2 and CCP3.

The optical control layer CCL may be disposed under the color filter layer CFL. The optical control layer CCL may include first to third optical control portions CCP1, CCP2 and CCP3, and a planarizing layer PL. On a plane, the first to third optical control portions CCP1, CCP2 and CCP3 may overlap the first to third pixel areas PXA-R, PXA-G and PXA-B, respectively. The first to third optical control portions CCP1, CCP2 and CCP3 may be separately disposed (or spaced apart) from each other. The first to third optical control portions CCP1, CCP2 and CCP3 may be separately disposed by the partition pattern BMP. The first to third optical control portions CCP1, CCP2 and CCP3 may be disposed in the opening parts BW-OH1, BW-OH2 and BW-OH3, defined in the partition pattern BMP.

The first to third optical control portions CCP1, CCP2 and CCP3 may be parts for converting source light provided from the light emitting element layer EDL or transmitting the source light provided without converting its wavelength.

The optical control layer CCL may include color conversion particles, and each of the color conversion particles may include a quantum dot or a phosphor.

The optical control layer CCL may include a first optical control portion CCP1 including a first quantum dot or a first phosphor, which converts first color light provided from the light emitting element OLED into second color light, a second optical control portion CCP2 including a second quantum dot or a second phosphor, which converts first color light into third color light, and a third optical control portion CCP3 which transmits first color light without converting its wavelength. The first optical control portion CCP1 may provide red light that is the second color light, and the second optical control portion CCP2 may provide green light that is the third color light. The third optical control portion CCP3 may transmit and provide blue light that is the first color light provided from the light emitting element OLED. In an embodiment, for example, the first quantum dot and the first phosphor may be red quantum dots, and the second quantum dot and the second phosphor may be green quantum dots.

The optical control layer CCL may include a small amount of color filter particles. In an embodiment, the first and second optical control portions CCP1 and CCP2 may include a small amount of color filter particles. The third optical control portion CCP3 may not include color filter particles.

The quantum dot means the crystal of a semiconductor compound. The quantum dot may emit light of various wavelengths, because an energy band gap may be controlled by controlling the size of the quantum dot or controlling an element ratio in the quantum dot. In an embodiment, for example, the diameter of the quantum dot may be in a range of about 1 nanometer (nm) to about 10 nm. Accordingly, a light emitting element emitting light of various wavelengths may be achieved by using quantum dots having different sizes, or quantum dots having different element ratios in the quantum dots. In an embodiment, the quantum dot may be constituted to emit red, green or blue light. In addition, the quantum dots may be constituted to combine light of various colors to emit white light.

The quantum dot may be synthesized by a chemical bath deposition, a metal organic chemical vapor deposition, a molecular beam epitaxy or a similar process therewith. The chemical bath deposition is a method of growing quantum dot particle crystal after mixing an organic solvent and a precursor material. During the growth of the crystal, the organic solvent naturally plays the role of a dispersant coordinated at the surface of the quantum dot crystal and may control the growth of the crystal. Accordingly, the chemical bath deposition is more desirable than a vapor deposition method such as a metal organic chemical vapor deposition (MOCVD) and a molecular beam epitaxy (MBE), and may control the growth of the quantum dot particle through a low cost process.

The quantum dot may have a single structure in which the concentration of each element included in the quantum dot is uniform, or a double structure of a core-shell. For example, a material included in the core and a material included in the shell may be different from each other. The shell of the quantum dot may play the role of a protection layer for preventing the chemical deformation of the core to maintain semiconductor properties and/or a charging layer for providing the quantum dot with electrophoresis properties. The shell may be a single layer or a multilayer. In the core/shell structure, a concentration gradient may be present, by which the concentration of an element in the shell decreases toward the core.

The core of the quantum dot may be selected from II-VI group compounds, III-VI group compounds, I-III-VI group compounds, III-V group compounds, III-II-V group compounds, IV-VI group compounds, IV group elements, IV group compounds, and combinations thereof.

The II-VI group compound may be selected from the group consisting of: a binary compound such as CdSe, CdTe, CdS, ZnS, ZnSe, ZnTe, ZnO, HgS, HgSe, HgTe, MgSe, MgS and mixtures thereof; a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof; and a quaternary compound such as HgZnTeS, CdZnSeS, CdZnSeTe, CdZnSTe, CdHgSeS, CdHgSeTe, CdHgSTe, HgZnSeS, HgZnSeTe, and mixtures thereof.

The III-VI group compound may include: a binary compound such as $In_2S_3$, and $In_2Se_3$; a ternary compound such as $InGaS_3$, and $InGaSe_3$; or arbitrary combinations thereof.

The I-III-VI group compound may be selected from: a ternary compound such as AgInS, $AgInS_2$, CuInS, $CuInS_2$, $AgGaS_2$, $CuGaS_2$ $CuGaO_2$, $AgGaO_2$, $AgAlO_2$ and mixtures thereof; or a quaternary compound such as $AgInGaS_2$, and $CuInGaS_2$.

The III-V group compound may be selected from: a binary compound such as GaN, GaP, GaAs, GaSb, AlN, AlP, AlAs, AlSb, InN, InP, InAs, InSb and mixtures thereof; a ternary compound such as GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb and mixtures thereof; a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof. In addition, the III-V group compound may further include a II group metal. For example, InZnP, etc. may be selected as a III-II-V group compound.

The IV-VI group compound may be selected from: a binary compound such as SnS, SnSe, SnTe, PbS, PbSe, PbTe and mixtures thereof; a ternary compound such as SnSeS, SnSeTe, SnSTe, PbSeS, PbSeTe, PbSTe, SnPbS, SnPbSe, SnPbTe and mixtures thereof; and a quaternary compound such as SnPbSSe, SnPbSeTe, SnPbSTe and mixtures thereof. The IV group element may be selected from Si, Ge and a mixture thereof. The IV group compound may be a binary compound selected from SiC, SiGe and a mixture thereof.

The IV group element or compound may include: a single element compound such as Si, and Ge; a binary compound such as SiC, and SiGe; or arbitrary combinations thereof.

In this case, each element included in a polynary compound such as the binary compound, the ternary compound and the quaternary compound may be at uniform concentration or non-uniform concentration in a particle. That is, the chemical formulae mean the types of elements included in the compound, and the element ratio in the compound may be different. For example, $AgInGaS_2$ may mean $AgIn_xGa_{1-x}S_2$ (x is a real number of 0 to 1).

The shell of the quantum dot may include a metal or non-metal oxide, a semiconductor compound, or combinations thereof.

For example, the metal or non-metal oxide may include: a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and NiO; or a ternary compound such as $MgAl_2O_4$, $CoFe_2O_4$, $NiFe_2O_4$ and $CoMn_2O_4$. However, an embodiment of the invention is not limited thereto.

In addition, the semiconductor compound may include CdS, CdSe, CdTe, ZnS, ZnSe, ZnTe, ZnSeS, ZnTeS, GaAs, GaP, GaS, GaSe, AgGaS, $AgGaS_2$, GaSb, HgS, HgSe, HgTe, InAs, InP, InGaP, InSb, AlAs, AlP, AlSb, etc. However, an embodiment of the invention is not limited thereto.

The quantum dot may have a full width of half maximum (FWHM) of emission wavelength spectrum of about 45 nm or less, e.g., about 40 nm or less, or about 30 nm or less. when the quantum dot has a FWHM in the above range, color purity or color reproducibility may be improved. In addition, light emitted via such quantum dot is emitted in all directions, and light view angle may be improved.

The type of the quantum dot may be commonly used type in the art, without specific limitation, but may particularly be spherical, pyramidal, multi-arm, or cubic nanoparticle, nanotube, nanowire, nanofiber, nanoplate particle, etc. may be used.

As described above, the color of light emitted may be controlled based on the particle size of the quantum dot, and accordingly, the quantum dot may have light of various colors including blue, red and green. If the particle size of the quantum dot decreases, light in a shorter wavelength region may be emitted. For example, for the quantum dots having a same core, the particle size of the quantum dot that emits green light may be smaller than the particle size of the quantum dot that emits red light. In addition, for the quantum dots having the same core, the particle size of the quantum dot that emits blue light may be smaller than the particle size of the quantum dot that emits green light.

However, an embodiment of the invention is not limited thereto, and for the quantum dots having a same core, the particle size may be controlled based on the material for forming the shell and the thickness of the shell. When the quantum dot has various colors of light such as blue, red and green, the quantum dot having different emitting colors may have different materials of the core.

The quantum dot may include a ligand. Detailed description on the ligand will be given referring to FIG. 7B.

Examples of the green phosphor may include manganese-doped zinc silicon oxide-based phosphor ($Zn_2SiO_4$:Mn), europium-doped strontium gallium sulfide-based phosphor ($SrGa_2S_4$:Eu), or europium-doped barium silicon oxide chloride-based phosphor ($BasSi_2O_7Cl_4$:Eu), but an embodiment of the invention is not limited thereto.

Examples of the red phosphor may include praseodymium- or aluminum-doped strontium titanium oxide-based phosphor ($SrTiO_3$:Pr or $SrTiO_3$:Al), or praseodymium-doped calcium titanium oxide-based phosphor ($CaTiO_3$:Pr), but an embodiment of the invention is not limited thereto.

In an embodiment, the optical control layer CCL may further include a scatterer. The first optical control portion CCP1 may include a first quantum dot and the scatterer, and the second optical control controlling part CCP2 may include a second quantum dot and the scatterer.

The scatterer may be an inorganic particle. In an embodiment, for example, the scatterer may include at least one selected from $TiO_2$, ZnO, $Al_2O_3$, $SiO_2$, and hollow silica. The scatterer may include at least one selected from $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Each of the first optical control portion CCP1 and the second optical control portion CCP2 may include a base resin dispersing the quantum dots and the scatterer. In an embodiment, the first optical control portion CCP1 may include the first quantum dots and the scatterer dispersed in the base resin, and the second optical control portion CCP2 may include the second quantum dots and the scatterer dispersed in the base resin.

The base resin is a medium in which the quantum dots and the scatterer are dispersed, and may include or be composed of various resin compositions which may be referred to as a common binder. In an embodiment, for example, the base resin may be an acrylic resin, a urethane-based resin, a silicon-based resin, an epoxy-based resin, etc. The base resin may be a transparent resin.

The planarizing layer PL may be disposed under the optical control portions CCP1, CCP2 and CCP3, and the partition pattern BMP. The planarizing layer PL may planarize the bottom surface of the optical control panel OP and may be a protecting layer for preventing the introduction of external dust, etc.

In FIG. 5, the third optical control portion CCP3 and the planarizing layer PL are separately shown, but are shown for separating the disposed positions. The third optical control portion CCP3 and the planarizing layer PL may have a one body configuration, e.g., may be integrally formed with each other as a single unitary and indivisible part. That is, the third optical control portion CCP3 and the planarizing layer PL may include a same material and may be formed by a one process. In the process of forming the planarizing layer PL, which will be described later, the third optical control portion CCP3 may be formed with the planarizing layer PL in one body.

When viewed in the third direction DR3, the area of a part where the first color filter CF1 is disposed may be the same as the area of the first optical control portion CCP1. When viewed in the third direction DR, the area of a part where the second color filter CF2 is disposed, may be the same as the area of the second optical control portion CCP2. When viewed in the third direction DR, the area of a part where the selective absorption layer SA is disposed, may be the same as the area of the third optical control portion CCP3. That is, the area of the first pixel area PXA-R may be the same as the area of the first color filter CF1 and the area of the first optical control portion CCP1, the area of the second pixel area PXA-G may be the same as the area of the second color filter CF2 and the area of the second optical control portion CCP2, and the area of the third pixel area PXA-B may be the same as the area of the selective absorption layer SA and the area of the third optical control portion CCP3.

Accordingly, the optical control panel OP according to an embodiment has no alignment tolerance of the color filter layer CFL and the optical control layer CCL, and an aperture ratio may be improved, and high light extraction efficiency may be realized, in contrast to a case having an alignment tolerance.

In an embodiment, the thickness of the optical control layer CCL may be greater than the thickness of the color filter layer CFL. In an embodiment, for example, the thickness of the optical control layer CCL may be in a range of about 5 μm to about 20 μm, and the thickness of the color filter layer CFL may be in a range of about 0.5 μm to about 4 μm.

The display device DD may include a filling layer FL disposed between the display panel DP and the optical control panel OP. The filling layer FL may fill up a gap between the display panel DP and the optical control panel OP. The filling layer FL may function as a buffer between the display panel DP and the optical control panel OP. The filling layer FL may absorb impact and may increase the strength of the display device DD. A filling part FP may be formed using a filling resin including a polymer resin. In an embodiment, for example, the filling part FP may include a resin including an epoxy-based resin, a silicon-based resin, or an acrylic resin.

According to embodiments of the invention, the optical control panel may be formed by an inkjet process of one step in the pixel area in which the color filter layer and the optical control layer are defined by the partition pattern without any alignment tolerance, such that an aperture ratio may be improved, and light extraction efficiency may be improved.

FIG. 6A to FIG. 6G are cross-sectional views showing the processes of a method of manufacturing a display device DD (FIG. 5) according to an embodiment of the invention.

The method of manufacturing a display device according to an embodiment includes a process of forming a partition pattern BMP on a base layer BS, a process of forming a selective absorption layer SA on the base layer BS, and a process of injecting ink INK including color filter particles and color conversion particles on the selective absorption layer SA to form color filters CF1 and CF2, and optical control portions CCP1 and CCP2.

Figure 6A:
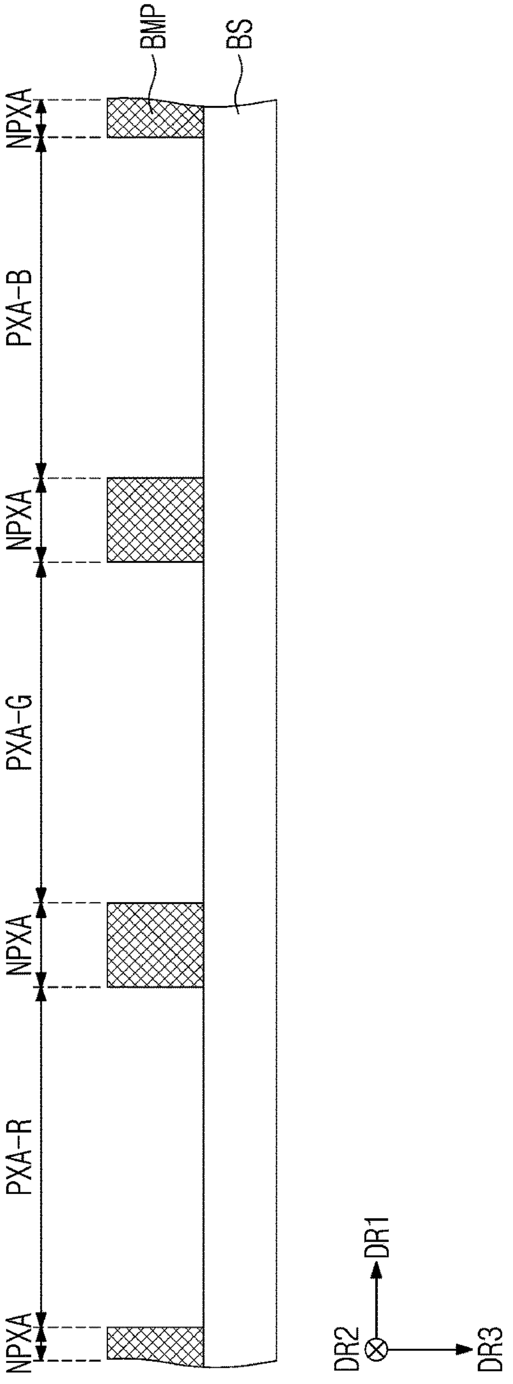
FIG. 6A to FIG. 6G are cross-sectional views showing the processes of a method of manufacturing a display device according to an embodiment of the invention.

FIG. 6A is a cross-sectional view illustratively showing the process of forming a partition pattern BMP on a base layer BS. By forming the partition pattern BMP on the base layer BS, a pixel area including a first pixel area PXA-R, a second pixel area PXA-G, and a third pixel area PXA-B may be defined.

The partition pattern BMP may be formed by a photolithography method, a transcription method, or a printing method such as off-set, reverse off-set and inkjet methods.

The partition pattern BMP may include a light shielding material as described in FIG. 5. In addition, the partition pattern BMP may have lyophobicity (or lyophobic characteristic) with respect to a selective absorption material so that a selective absorption layer SA (FIG. 6B) may be formed only in the pixel areas PXA-R, PXA-G and PXA-B, though applying the selective absorption material on the whole surface.

Figure 6B:
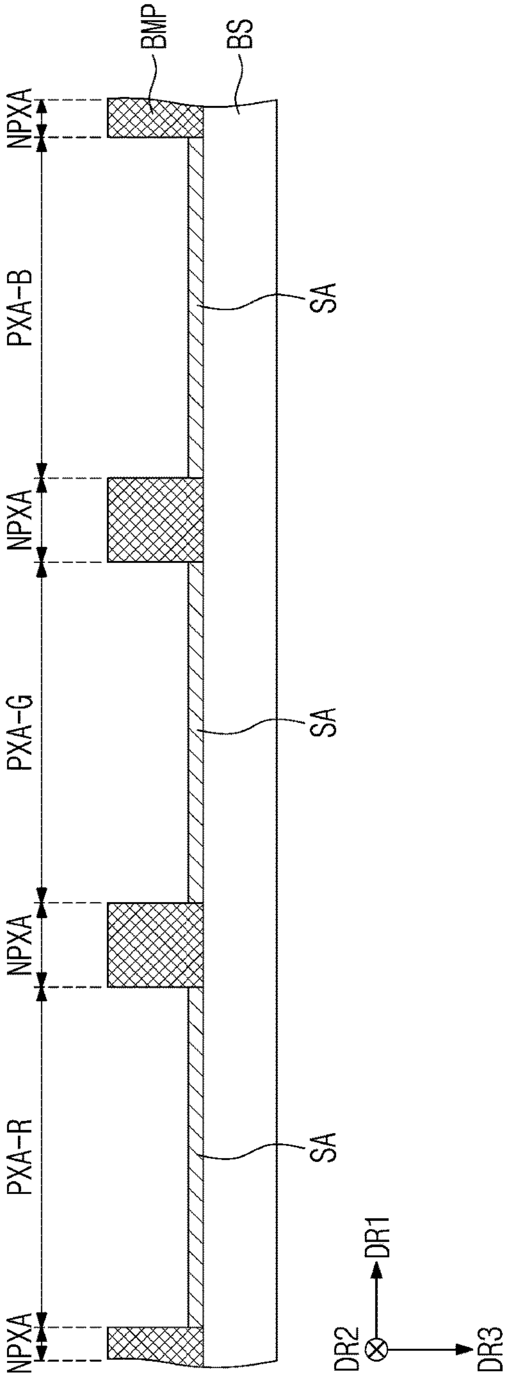

FIG. 6B is a cross-sectional view illustratively showing the process of forming a selective absorption layer SA in the pixel areas PXA-R, PXA-G and PXA-B through coating a selective absorption material on the base layer BS. The coating method of the selective absorption material is not particularly limited, but the selective absorption material may be applied and dried (cured) to form the selective absorption layer SA.

The selective absorption material may include metal hydroxide particles and a binder resin having a negative (−) surface zeta potential, to selectively absorb color filter particles CFP (FIG. 7A).

The metal hydroxide particle may include, for example, at least one selected from aluminum (Al), magnesium (Mg), barium (Ba), and calcium (Ca), but an embodiment of the invention is not limited thereto.

The binder resin having a negative (−) surface zeta potential may include at least one selected from a polyvinyl alcohol (PVA) resin, a (meth)acrylate copolymer resin, a polyvinyl butyral (PVB) resin, a hydroxypropyl cellulose (HPC) resin, a polyvinylpyrrolidone-vinyl acetate (PVP-VA) copolymer resin, and a polyacetal resin, but an embodiment of the invention is not limited thereto.

Figure 6C:
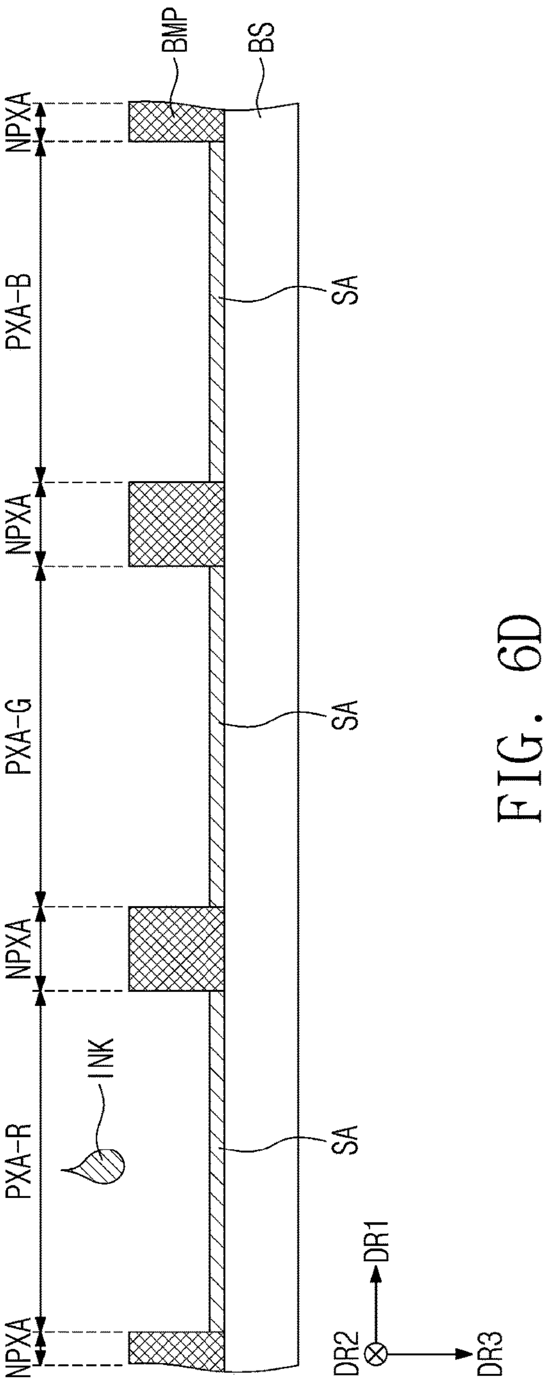
Figure 6D:
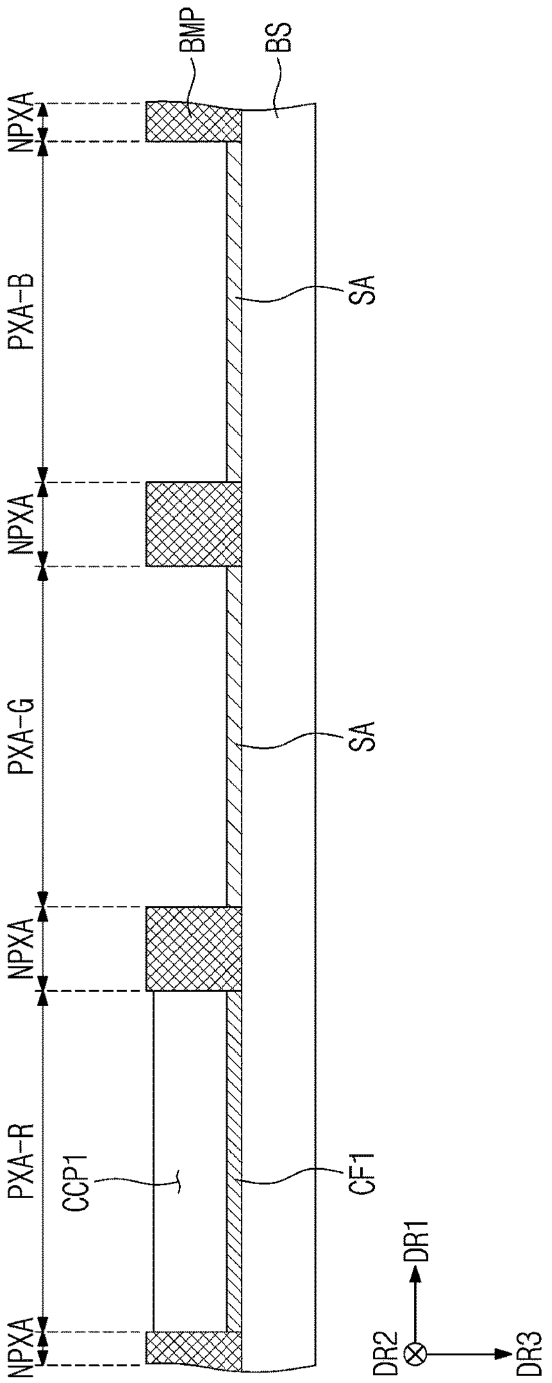
Figure 6E:
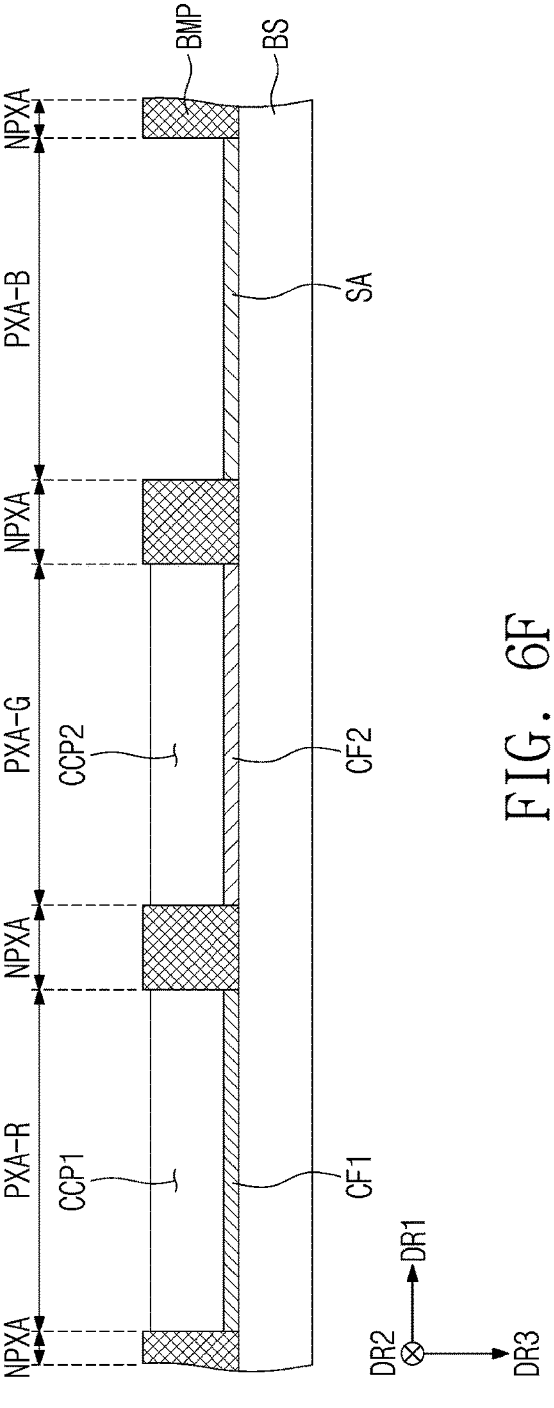

FIG. 6C to FIG. 6E illustratively show the process of injecting ink INK including color filter particles and color conversion particles on the selective absorption layer SA to form color filters CF1 and CF2, and optical control portions CCP1 and CCP2.

The color filters CF1 and CF2 and the optical control portions CCP1 and CCP2 may be formed by an inkjet process. In the inkjet process, Ink INK having a liquid phase may be provided, the ink INK provided may be separated into two layers as described later, and polymerized by a thermal curing process or a photocuring process to form the color filters CF1 and CF2 and the optical control portions CCP1 and CCP2.

The ink INK may include the above-described color filter particles and color conversion particles. A color conversion particle may include a phosphor or a quantum dot and may have a negative (−) surface zeta potential. A color filter particle may include a dye or a pigment and may have a positive (+) surface zeta potential. The ink INK may further include a solvent, a polymerizable monomer, and a photoinitiator.

The solvent may include a material having high affinity with the selective absorption layer SA. In an embodiment, for example, the solvent may be at least one selected from methyl cellosolve, ethyl cellosolve, butyl cellosolve, methyl cellosolve acetate, ethyl cellosolve acetate, butyl cellosolve acetate, methyl carbitol acetate, ethyl carbitol acetate, butyl carbitol acetate, diethylene glycol dimethyl ether, ethylene glycol monoisopropyl ether, propylene glycol monomethyl ether, N,N-dimethylacetamide, N-methyl pyrrolidone, N-butyrolactone, methyl isobutyl ketone, methyl ethyl ketone, ethyl acetate, n-butyl acetate, propylene glycol monomethyl ether acetate, propylene glycol monoethyl ether acetate, methyl lactate, ethyl lactate, ethyl pyruvate, dimethyl sulfoxide, dioxane, and dimethyl formamide. These solvents may be used alone or as a combination of two or more.

The polymerizable monomer acts as a solvent or dispersing medium for dissolving or dispersing the color filter particles and the color conversion particles, and is a material contributing to the formation of a polymer during applying the ink INK and curing to form a coated layer. In an embodiment, for example, the polymerizable monomer may be at least one selected from ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, ethylene glycol monomethylether(meth)acrylate, trimethylol propane tri(meth)acrylate, tris(meth)acryloyloxyethyl phosphate, and novolac epoxy (meth)acrylate.

The photoinitiator may be a compound selected from a trihalomethyltriazine compound, a benzyldimethylketal compound, an α-hydroxyketone compound, an α-aminoketone compound, an acylphosphine compound, a phosphineoxide compound, a metallocene compound, an oxime compound, a triarylimidazole dimer, an onium compound, a benzothiazole compound, a benzophenone compound, an acetophenone compound, a cyclopentadien-benzen-iron complex, a halomethyloxadiazole compound, and a 3-aryl-substituted coumarin compound. In an embodiment, for example, the photoinitiator may be selected from an oxime compound, an α-hydroxyketone compound, an α-aminoketone compound, an acylphosphine compound, and an oxime compound.

The process of forming the color filters CF1 and CF2 and the optical control portions CCP1 and CCP2 may include a process of injecting first ink INK including first color filter particles and first color conversion particles on the selective absorption layer SA in the first pixel area PXA-R and forming a first color filter CF1 and a first optical control portion CCP1, and a process of injecting second ink including second color filter particles and second color conversion particles on the selective absorption layer SA in the second pixel area PXA-G and forming a second color filter CF2 and a second optical control portion CCP2.

FIG. 6C illustratively shows the process of injecting first ink INK including first color filter particles and first color conversion particles on the selective absorption layer SA in the first pixel area PXA-R. each of the first color conversion particles may include the above-described phosphor or quantum dot and may have a negative (−) surface zeta potential. Each of the first color filter particles may include the above-described dye or pigment and may have a positive (+) surface zeta potential.

FIG. 6D illustratively shows the process of forming the first color filter CF1 and the first optical control portion CCP1. The first color filter CF1 may be formed through the absorption of the first color filter particles in the first ink INK by the selective absorption layer SA (FIG. 6C), and the first optical control portion CCP1 may be formed on the first color filter CF1 from an ink residue of the first ink INK, from which a portion of the first color filter particles is removed. The first color filter particles may be selectively absorbed by the selective absorption layer SA (FIG. 6C), and the first color conversion particles are rejected and only a small amount thereof may be absorbed. Accordingly, the first optical control portion CCP1 and the first color filter CF1 may include the color conversion particles and the color filer particles, the concentration of the color conversion particles may be higher in the first optical control portion CCP1 than in the first color filter CF1, and the concentration of the color filter particles may be higher in the first color filter CF1 than in the first optical control layer CCP1. In an embodiment, the number of particles (also referred to as "particle number") per unit volume of the color conversion particles is greater in the first optical control portion CCP1 than in the first color filter CF1, and the number of particles per unit volume of the color filter particles is greater in the first color filter CF1 than in the first optical control layer CCP1.

FIG. 6E illustratively shows the process of forming a second color filter CF2 and a second optical control portion CCP2. The second color filter CF2 may be formed through the absorption of the second color filter particles in the second ink injected by the selective absorption layer SA (FIG. 6D), and the second optical control portion CCP2 may be formed on the second color filter CF2 from an ink residue of the second ink, from which a portion of the second color filter particles is removed. The second color filter particles may be selectively absorbed by the selective absorption layer SA (FIG. 6D), and the second color conversion particles may be rejected and only a small amount thereof may be absorbed. Accordingly, the second optical control portion CCP2 and the second color filter CF2 may include the color conversion particles and the color filer particles, the concentration of the color conversion particles may be higher in the second optical control portion CCP2 than in the second color filter CF2, and the concentration of the color filter particles may be higher in the second color filter CF2 than in the second optical control layer CCP2. In an embodiment, the number of particles per unit volume of the color conversion particles is greater in the second optical control portion CCP2 than in the second color filter CF2, and the number of particles per unit volume of the color filter particles is greater in the second color filter CF2 than in the second optical control layer CCP2.

Figure 6F:
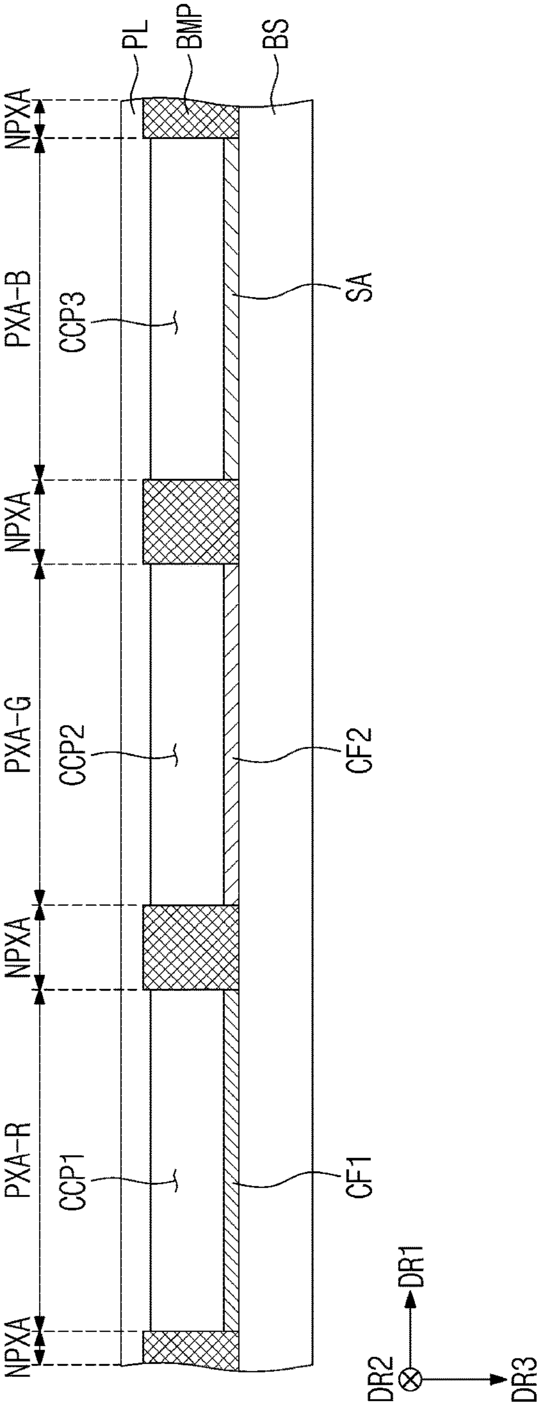

The method of manufacturing a display device of an embodiment may further include a process of forming a planarizing layer PL. FIG. 6F illustratively shows a process of forming a planarizing layer PL.

The process of forming the planarizing layer PL may include a process of forming a third optical control portion CCP3. That is, the planarizing layer PL and the third optical control portion CCP3 may be formed by a one-step process into a one body. In FIG. 6F, the planarizing layer PL and the third optical control portion CCP3 are separately shown for distinguishing the positions of disposition. The planarizing layer PL and the third optical control portion CCP3 may include a same material and have a one body configuration formed by a same process.

Figure 6G:
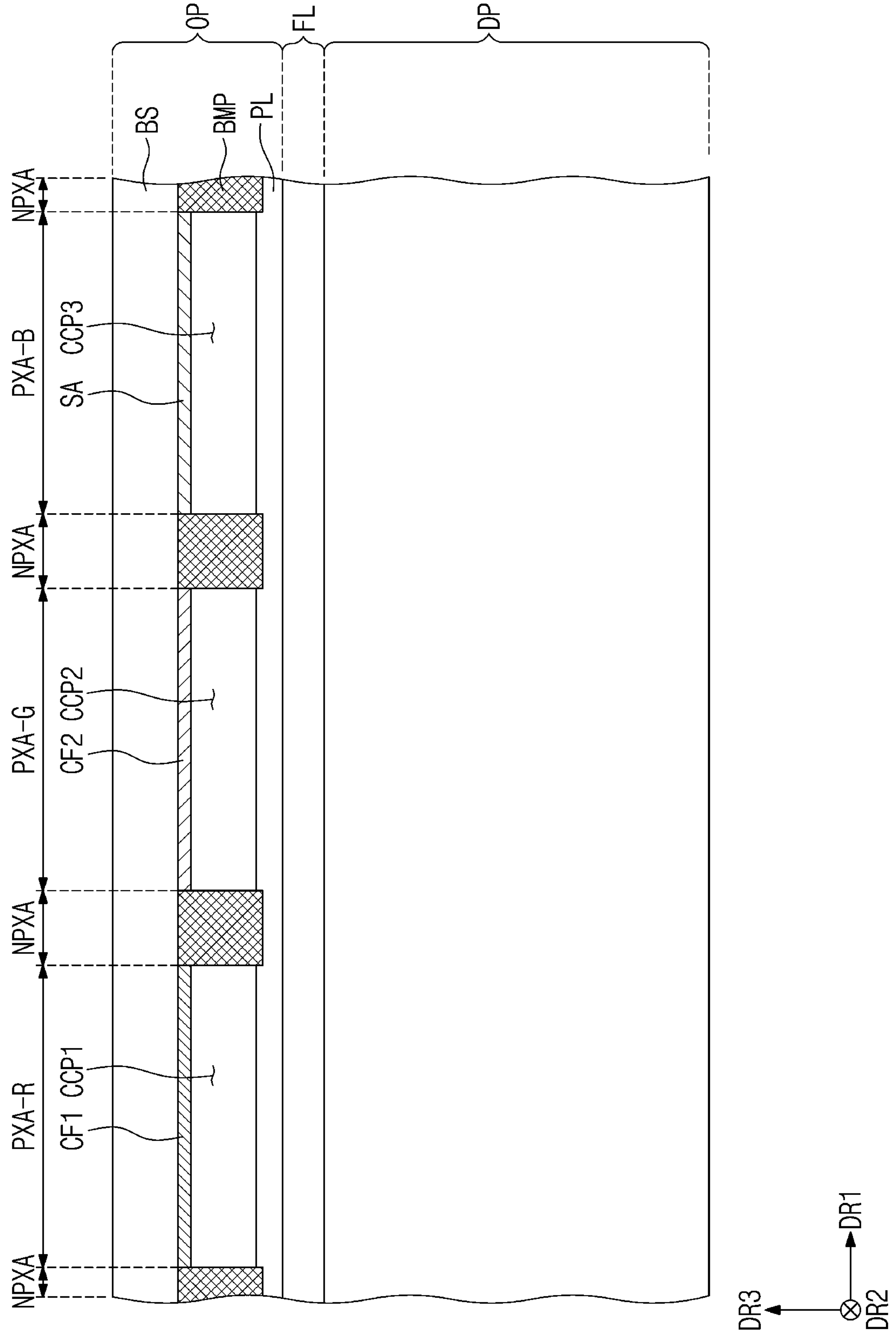

The method of manufacturing a display device of an embodiment may further include a process of attaching the optical control panel OP to the display panel DP. FIG. 6G illustratively shows a process of attaching the optical control panel OP to the display panel DP.

The optical control panel OP formed by FIG. 6A to FIG. 6G may be turned over and attached onto the display panel DP. The optical control panel OP may be attached to the display panel DP by the filling layer FL including a filling resin.

Figure 7B:
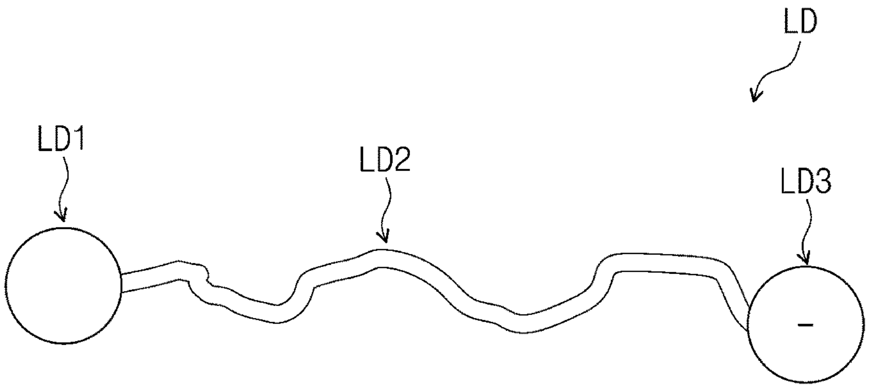
FIG. 7B is a schematic diagram showing a ligand according to an embodiment of the invention.

FIG. 7A is a schematic diagram showing a process of the method of manufacturing a display device DD (FIG. 5) according to an embodiment of the invention. FIG. 7B is a schematic diagram showing a ligand LD according to an embodiment of the invention.

FIG. 7A schematically shows an enlarged view of a selective absorption layer SA and an adjacent area NSA to the selective absorption layer SA in the process of forming the first color filter CF1 and the first optical control portion CCP1 in FIG. 6D.

In an embodiment, as described above, the selective absorption layer SA includes metal oxide particles (not shown) and a binder resin BD having a negative (−) surface zeta potential. The color filter particles CFP may have a positive (+) surface zeta potential, and the color conversion particles CCP may have a negative (−) surface zeta potential. In an embodiment, the color conversion particles CCP may include a quantum dot QD and a ligand LD. Referring to FIG. 7B, the ligand LD may include a first terminal portion LD1 combined with the quantum dot QD (FIG. 7A), a second terminal portion LD3 providing a color conversion particle CCP (FIG. 7A) with a negative (−) surface zeta potential, and an intermediate portion LD2 connected between the first terminal portion LD1 and the second terminal portion LD3.

Accordingly, as shown in FIG. 7A, the selective absorption layer SA may selectively absorb the color filter particles CFP having a positive (+) surface zeta potential and may selectively exclude the color conversion particles CCP having a negative (−) surface zeta potential.

As a result, the first color filter CF1 of FIG. 6D and the second color filter CF2 of FIG. 6E may include a large amount of the color filter particles CFP and a small amount of the color conversion particles CCP. In addition, the first optical control portion CCP1 of FIG. 6D and the second optical control portion CCP2 of FIG. 6E may include a large amount of the color conversion particles CCP and a small amount of the color filter particles CFP.

Since the selective absorption layer SA selectively absorbs the color filter particles CFP, the concentration change of the color filter particles CFP and the color conversion particles CCP may be formed at the interface of the selective absorption layer SA and the adjacent area NSA. Accordingly, the color filters CF1 and CF2 (FIG. 6D and FIG. 6E) and the optical control portions CCP1 and CCP2 (FIG. 6D and FIG. 6E) may be distinguished.

According to an embodiment of the invention, the method of manufacturing the optical control panel may form the selective absorption layer in the pixel area, and the color filter layer and the optical control layer may be separately formed by an inkjet process of one step using an ink including the color filter particles and the color conversion particles. Accordingly, process cost may be reduced in contrast to a case of forming a color filter layer and an optical control layer by independent inkjet processes, and processability may be improved.

Figure 8A:
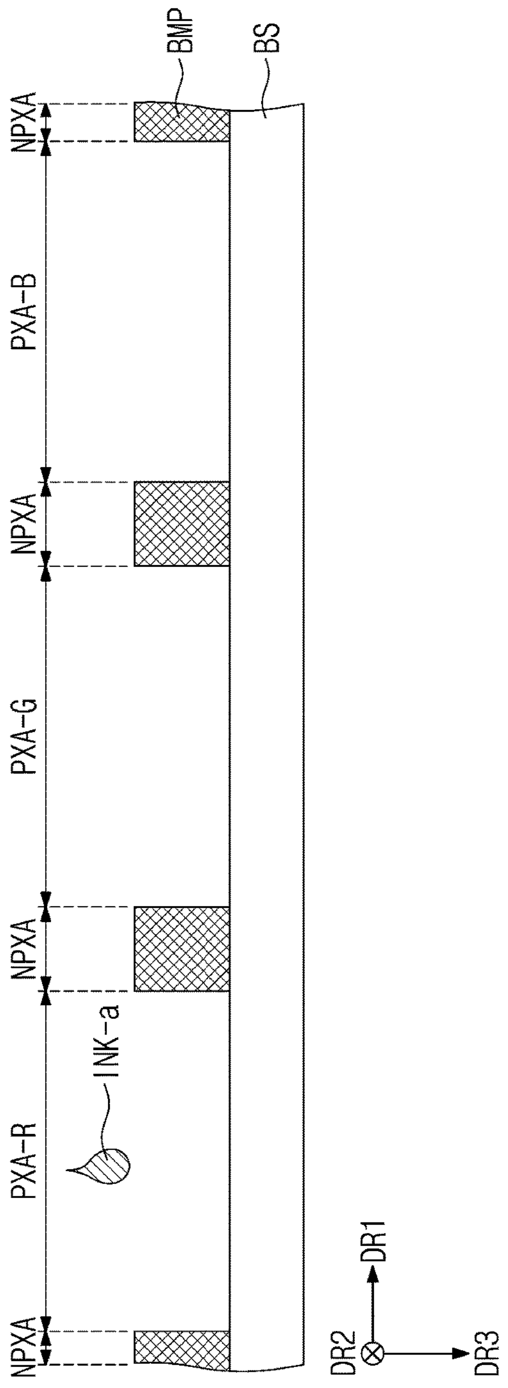
FIG. 8A to FIG. 9C are cross-sectional views showing the processes of a method of manufacturing a display device according to an embodiment of the invention.
Figure 8B:
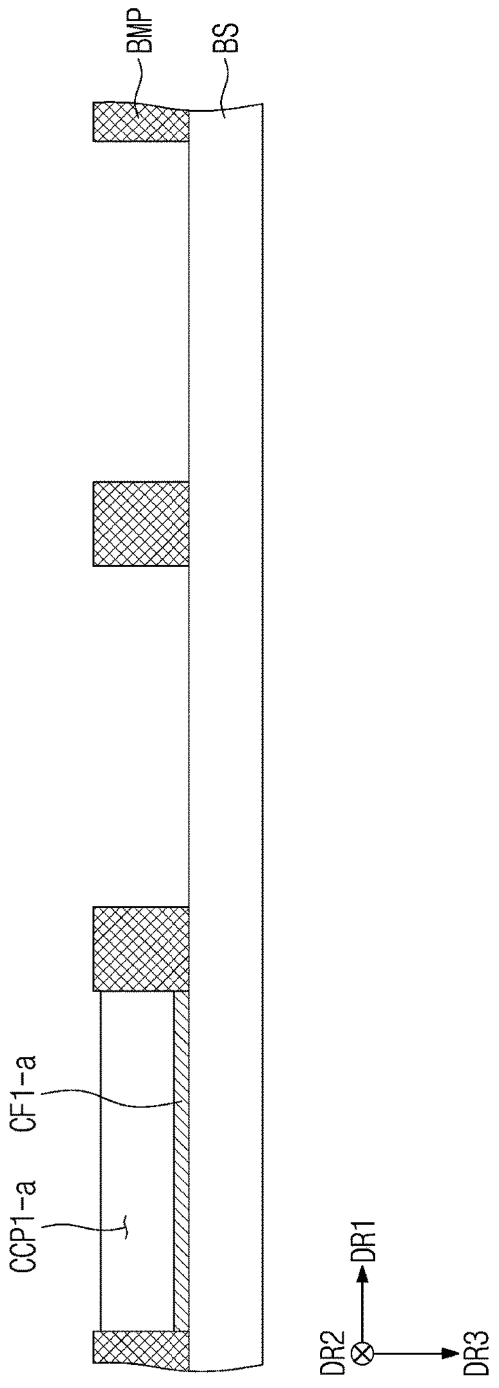

FIG. 8A and FIG. 8B are cross-sectional views showing the processes of a method of manufacturing a display device according to an embodiment of the invention.

FIG. 8A and FIG. 8B are cross-sectional views showing another embodiment of the processes of the method of manufacturing a display device of the invention. The embodiment shown in FIG. 8A and FIG. 8B is substantially the same as the embodiment shown in FIGS. 6A to 6G except for the processes of forming the selective absorption layer SA and injecting ink INK-a, in which the ink INK-a may be injected directly on a base layer BS to form a color filter CF1-*a* and an optical control portion CCP1-*a*.

The ink INK-a may include color conversion particles, color filter particles, and two or more solvents having different solubility with respect to the color conversion particles and the color filter particles and boiling points. When the ink INK-a dries, the composition of the solvent may change, the color filter particles with low solubility may be phase separated first to form a color filter CF1-*a* on the base layer BS, and then, the color conversion particles may form an optical control portion CCP1-*a* on the color filter CF1-*a*.

The same contents as those described above FIG. 6A to FIG. 6F may be applied except that the process of forming the color filter CF1-*a* and the optical control portion CCP1-*a* is excluded, and the selective absorption layer SA (FIG. 6F) is not included in the third pixel area PXA-B.

Figure 9A:
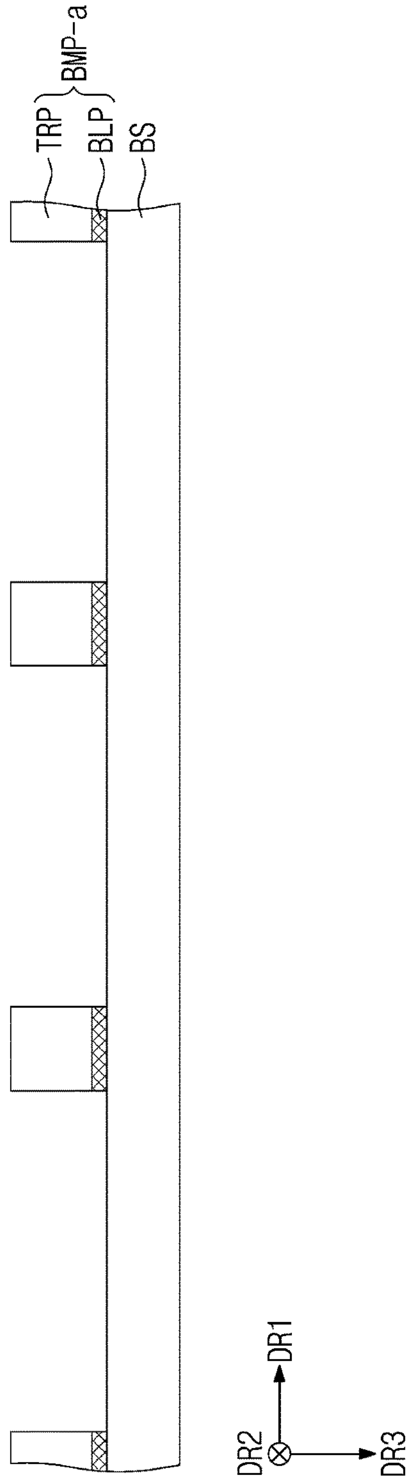
Figure 9B:
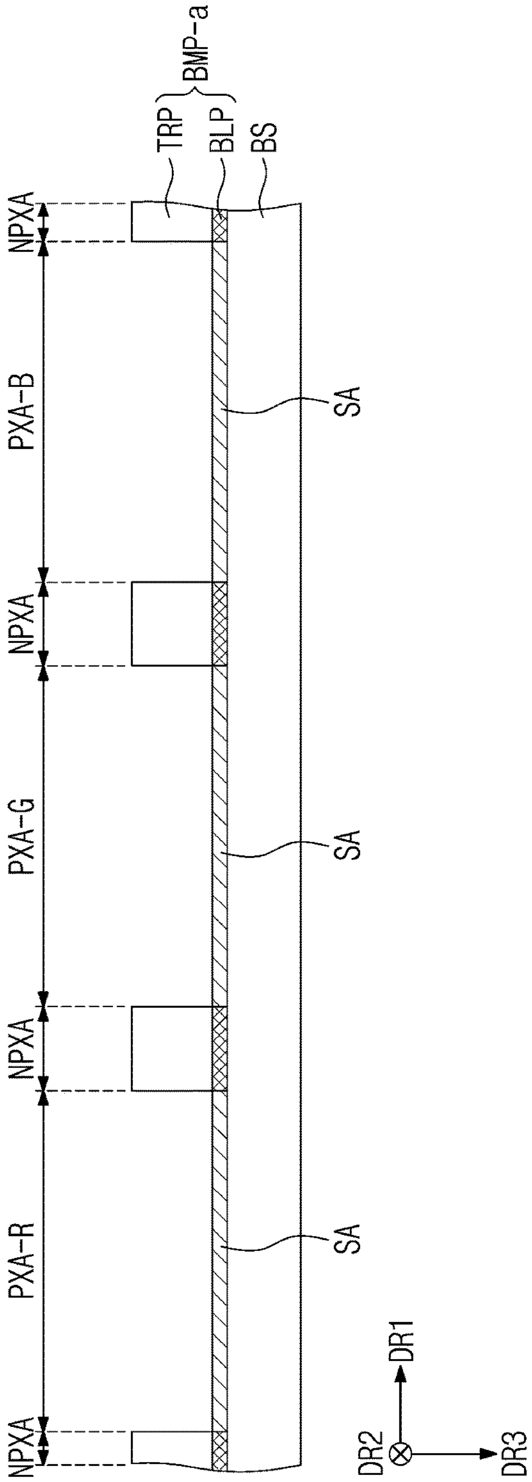
Figure 9C:
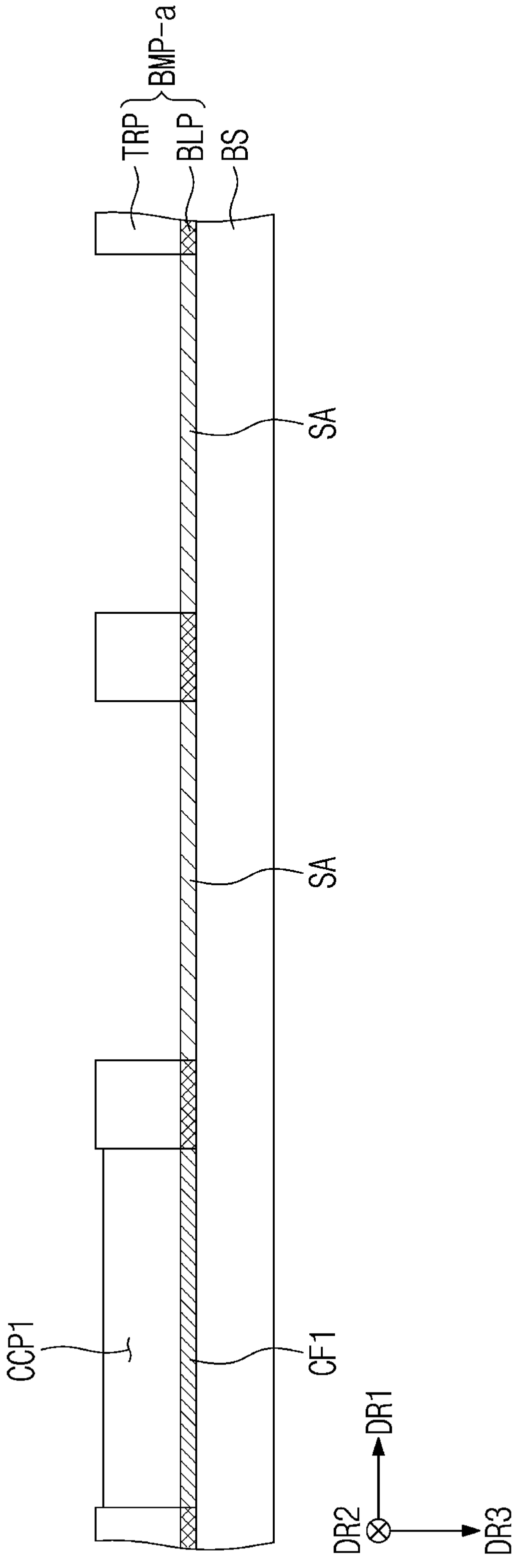

FIG. 9A to FIG. 9C are cross-sectional views showing the processes of the method of manufacturing a display device according to an embodiment of the invention.

FIG. 9A to FIG. 9C are cross-sectional views showing an alternative embodiment of the processes of the method of manufacturing a display device of the invention. The embodiment shown in FIG. 8A and FIG. 8B is substantially the same as the embodiment shown in FIGS. 6A to 6G except for the processes of forming a partition pattern BMP-a having two layers, differently from the partition pattern BMP which is a single layer in FIG. 6A.

Referring to FIG. 9A, a process of forming a partition pattern BMP-a may include a process of forming a light shielding pattern BLP and a transparent pattern TRP on a base layer BS. The light shielding pattern BLP may be referred to as a first portion of the partition pattern BMP-a, and the transparent pattern TRP may be referred to as a second portion of the partition pattern BMP-a.

The light shielding pattern BLP may include a same light shielding material as the above-described partition pattern BMP (FIG. 5). The transparent pattern TRP may use any material that may form a partition wall, without limitation. In addition, the transparent pattern TRP may have lyophobicity. In a case, the transparent pattern TRP may include a light shielding material, but an additional process is added. Accordingly, a transparent material may be used to form the partition wall to improve processability.

Referring to FIG. 9B, since the transparent pattern TRP has lyophobicity, a selective absorption layer SA may be formed only in pixel areas PXA-R, PXA-G and PXA-B. The selective absorption layer SA may be formed into a same thickness as the light shielding pattern BLP.

FIG. 9C shows a process of applying and drying ink INK (FIG. 6C) in a first pixel area PXA-R to form a first color filter CF1 and a first optical control portion CCP1. The first color filter CF1 may be formed into a same thickness as the light shielding pattern BLP, and the first optical control portion CCP1 may be formed into substantially a same thickness as the transparent pattern TRP. In an embodiment, the first color filter CF1 may be in a same layer as the light shielding pattern BLP, and the first optical control portion CCP1 may be in a same layer as the transparent pattern TRP. As shown in FIG. 9A, the first optical control portion CCP1 may be formed not to overflow on the partition pattern BMP-a.

In such an embodiment, the same contents as in FIG. 6A to FIG. 6F may be applied except that the process of forming the color filter CF1-*a* and the optical control portion CCP1-*a* is excluded, and the selective absorption layer SA (FIG. 6F) is not included in the third pixel area PXA-B.

To evaluate the light conversion efficiency of the optical control layer according to embodiments of the invention, optical control layers of the Example, Comparative Example 1 and Comparative Example 2 were formed.

(1) Preparation of Ink

1) Preparation of Color Filter Particle Ink

7 Parts by weight of a mixture pigment of Color Index (C. I.) Green 36 and Yellow 139 in a weight ratio of 7:3 were dispersed using 5 parts by weight of a polyamine-based dispersion resin as a cationic dispersant. A color filter particle ink was prepared by mixing 8 parts by weight of 1,6-hexanedioldimethacrylate as a curable monomer, 2 parts by weight of a binder polymer (product of Asahi Kasei), 1 part by weight of an oxime compound (OXE-01) as a photoinitiator and 45 parts by weight of butylcarbitol acetate butyl ether as a solvent.

2) Preparation of Color Conversion Particle Ink

A color conversion particle ink was prepared by mixing 20 parts by weight of InP Green quantum dots of Hansol Co., of which surfaces were substituted with a ligand having a negative (−) zeta potential, 20 parts by weight of 1,6-hexanedioldimethacrylate as a curable monomer, and 1 part by weight of an oxime compound (OXE-01) as a photoinitiator.

3) Preparation of Mixture Ink of Color Filter Particles and Color Conversion Particles 7 Parts by weight of a mixture pigment of Color Index (C. I.) Green 36 and Yellow 139 in a weight ratio of 7:3 was dispersed using 5 parts by weight of a polyamine-based dispersion resin that is a cationic dispersant. A mixture ink was prepared by mixing 20 parts by weight of InP Green quantum dots of Hansol Co., of which surfaces were substituted with a ligand having a negative (−) zeta potential, 40 parts by weight of 1,6-hexanedioldimethacrylate as a curable monomer, 1 part by weight of an oxime compound (OXE-01) as a photoinitiator and 10 parts by weight of butylcarbitol acetate as a solvent.

4) Preparation of Selective Absorption Material

A dispersion solution composed of 360 parts by weight of 5% polyvinyl alcohol (PVA-145 Kuraray) water solution including aluminum hydrate powder so that the solid content concentration was 11.4 weight percent (wt %), 50 parts by weight of N-vinyl acrylamidine hydrochloride-acrylamide of a molecular weight of 20000, and a small amount of a defoaming agent was prepared. To 86 parts by weight of the dispersion solution, 14 parts by weight of a polyvinyl alcohol aqueous solution having a concentration of 10 wt %, and a small amount of a silicon-based additive were mixed, and a small amount of hydrochloric acid was added to adjust pH to 4 to prepare a selective absorption material.

(2) Formation of Optical Control Panel

1) Example

A partition pattern having a lattice shape with a thickness of about 10 μm and defining a pixel area of about 90 micrometers (μm)×190 μm, was formed on a glass substrate having a thickness of about 0.5 millimeter (mm) using a black photoresist having surface lyophobic properties.

The selective absorption material was applied on an opening (pixel area) defined in the partition pattern of the lattice shape, and the solvent was dried and cured to form a selective absorption layer having a final thickness of about 2 μm. During applying the selective absorption material (solution), the solution was not applied on the lattice pattern but filled only in the pixel area, dried and cured to form the selective absorption layer only in the pixel area.

In the pixel area, a mixture ink including both the color conversion particles and the color filter particles was injected using an inkjet apparatus, dried and cured by ultraviolet. The color filter particles were absorbed by the selective absorption layer, and the color conversion particles was not absorbed by the selective absorption layer to form a film dividing layers after curing. The color filter particles were absorbed by the selective absorption layer to form a color filter layer, and an optical control layer was formed on the color filter layer. The total thickness of the coated layer was about 10 μm.

2) Comparative Example 1

A selective absorption layer was not formed in an opening (pixel area) defined in the partition pattern having a lattice shape, and ink including only color filter particles was applied using an inkjet apparatus, dried and cured to form a color filter layer having a thickness of about 2 μm.

On the color filter layer, ink including only color conversion particles was applied in the pixel area using an inkjet apparatus, dried and cured by ultraviolet to form an optical control layer having a thickness of about 8 μm.

3) Comparative Example 2

A selective absorption layer was not formed in an opening (pixel area) defined in the partition pattern having a lattice shape, and ink including both color conversion particles and color filter particles was applied using an inkjet apparatus, dried and cured by ultraviolet. A layer of a mixture of the color filter particles and color conversion particles and having a thickness of about 10 μm, was formed.

(3) Evaluation of Light Conversion Efficiency

Each of the optical control panels on which a coated layer was formed of the Example and Comparative Examples 1 and 2 was cut into a length and width of about 20 mm each, and the light conversion ratio of blue light was measured. Here, the measurement of the light conversion ratio of blue light was conducted by an integrating hemisphere-type measurement apparatus (Otsuka). Blue light of about 450 nm to about 460 nm was applied to each of the optical control panels, all green light or red light omnidirectionally emitted to upward was captured and calculated into an integrated value, the increment of light converted into green light or red light in contrast to a reduction amount by the absorption of blue light was calculated, and a light conversion ratio was measured.

The optical control panel having a double-layer structure in which a color filter layer and an optical control layer were formed by independent inkjet processes (Comparative Example 1) was set as a standard (100%) for relative comparison, and the light conversion ratios of the optical control panels formed by other methods (Example and Comparative Example 2) were measured and compared.

TABLE 1

| | Light conversion ratio (%) |
|---|---|
| Example | 97% |
| Comparative Example 1 | 100% |
| Comparative Example 2 | 14% |

Referring to Table 1, the optical control panel of the Example showed almost equal light conversion efficiency as the optical control panel of Comparative Example 1, having a double-layer structure in which a color filter layer and an optical control layer were formed by independent inkjet processes. In an embodiment of the optical control panel according to the invention, the color filter layer and the optical control layer may be formed by a one-step inkjet process, and it can be confirmed that the cost of an expensive inkjet process may be reduced, and almost equal light conversion efficiency was shown as the optical control panel in which a color filter layer and an optical control layer were formed by independent inkjet processes.

In addition, the optical control panel of the Example showed very high light conversion efficiency when compared to the optical control panel of Comparative Example 2 in which a mixture ink was applied, dried and cured without forming a selective absorption layer. An embodiment of the optical control panel according to the invention is formed by a one-step inkjet process, but a selective absorption layer is formed into a color filter layer containing a large amount of color filter particles, and an optical control layer containing a large amount of color conversion particles is formed on the selective absorption layer. Since the optical control panel of Comparative Example 2 does not include a selective absorption layer, color filter particles and color conversion particles may be mixed in uniform concentrations. Accordingly, in the optical control panel of Comparative Example 2, it is considered that blue light incident may be blocked by the color filter particles before arriving at the color conversion particles, and light loss may arise to reduce light conversion efficiency.

According to embodiments of the invention, as described above, the display device of the disclosure may show high light extraction efficiency, because the alignment tolerance of an optical control layer and a color filer layer is removed, and the aperture ratio of a pixel area is improved.

In addition, in embodiments of the method of manufacturing a display device of the disclosure, an optical control portion and a color filter may be formed by a one-step process, and processability may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device, comprising:
- a lower panel comprising a light emitting element layer; and
- an upper panel disposed on the lower panel, wherein
- the upper panel comprises:
  - a partition pattern;
  - an optical control layer comprising multiple optical control portions which are separately disposed by the partition pattern; and
  - a color filter layer disposed on the optical control layer, and comprising multiple color filters which are separately disposed by the partition pattern,
- each of the optical control layer and the color filter layer comprises color conversion particles and color filter particles,
- a particle number per unit volume of the color conversion particles is greater in the optical control layer than in the color filter layer, and
- a particle number per unit volume of the color filter particles is greater in the color filter layer than in the optical control layer.

2. The display device of claim 1, wherein the color filter layer comprises metal hydroxide particles, and a binder resin having a negative (−) surface zeta potential.

3. The display device of claim 2, wherein each of the metal hydroxide particles comprises at least one selected from aluminum (Al), magnesium (Mg), barium (Ba), and calcium (Ca).

4. The display device of claim 2, wherein the binder resin having the negative (−) surface zeta potential comprises at least one selected from a polyvinyl alcohol (PVA) resin, a (meth)acrylate copolymer resin, a polyvinyl butyral (PVB) resin, a hydroxypropyl cellulose (HPC) resin, a polyvinylpyrrolidone-vinyl acetate (PVP-VA) copolymer resin, and a polyacetal resin.

5. The display device of claim 1, wherein each of the color conversion particles comprises a phosphor or a quantum dot and has a negative (−) surface zeta potential, and
- each of the color filter particles comprises a dye or a pigment and has a positive (+) surface zeta potential.

6. The display device of claim 1, wherein each of the color conversion particles comprises a quantum dot and a ligand, and
- the ligand comprises:
  - a first terminal portion combined with the quantum dot;
  - a second terminal portion providing each of the color conversion particles with a negative (−) surface zeta potential; and
  - an intermediate portion connected between the first terminal portion and the second terminal portion.

7. The display device of claim 1, wherein a thickness of the optical control layer is greater than a thickness of the color filter layer.

8. The display device of claim 1, wherein the partition pattern comprises a first portion disposed in a same layer as the color filter layer, and a second portion disposed under the first portion,
- the first portion is a light shielding pattern, and the second portion is a transparent pattern having lyophobicity.

9. A display device comprising:
- a lower panel comprising a light emitting element layer; and
- an upper panel disposed on the lower panel, wherein
- the upper panel comprises:
  - a partition pattern;
  - an optical control layer comprising multiple optical control portions which are separately disposed by the partition pattern; and
  - a color filter layer disposed on the optical control layer, and comprising multiple color filters which are separately disposed by the partition pattern, and
- the color filter layer comprises metal hydroxide particles, and a binder resin having a negative (−) surface zeta potential.

10. The display device of claim 9, wherein each of the optical control layer and the color filter layer comprises color conversion particles and color filter particles.

11. The display device of claim 10, wherein each of the color conversion particles comprises a phosphor or a quantum dot, and has a negative (−) surface zeta potential, and
- each of the color filter particles comprises a dye or a pigment, and has a positive (+) surface zeta potential.

12. The display device of claim 10, wherein each of the color conversion particles comprises a quantum dot and a ligand, and
- the ligand comprises:
  - a first terminal portion combined with the quantum dot;

a second terminal portion providing each of the color conversion particles with a negative (−) surface zeta potential; and an intermediate portion connected between the first terminal portion and the second terminal portion.

13. The display device of claim 10, wherein a thickness of the optical control layer is greater than a thickness of the color filter layer.

14. The display device of claim 10, wherein the partition pattern comprises a first portion disposed in a same layer as the color filter layer, and a second portion disposed under the first portion, the first portion is a light shielding pattern, and the second portion is a transparent pattern having lyophobicity.

* * * * *